(12) United States Patent
Riho

(10) Patent No.: US 8,908,411 B2
(45) Date of Patent: Dec. 9, 2014

(54) SEMICONDUCTOR DEVICE

(71) Applicant: Elpida Memory, Inc., Tokyo (JP)

(72) Inventor: Yoshiro Riho, Tokyo (JP)

(73) Assignee: PS4 Luxco S.a.r.l., Luxembourg (LU)

( * ) Notice: Subject to any disclaimer, the term of this patent is extended or adjusted under 35 U.S.C. 154(b) by 0 days.

(21) Appl. No.: 14/054,482

(22) Filed: Oct. 15, 2013

(65) Prior Publication Data

US 2014/0043885 A1  Feb. 13, 2014

Related U.S. Application Data

(63) Continuation of application No. 13/653,684, filed on Oct. 17, 2012, now Pat. No. 8,599,596, which is a continuation of application No. 12/838,028, filed on Jul. 16, 2010, now Pat. No. 8,310,855.

(30) Foreign Application Priority Data

Jul. 29, 2009 (JP) ................. 2009-176263

(51) Int. Cl.
*G11C 5/02* (2006.01)
*G11C 5/06* (2006.01)
*G11C 11/4093* (2006.01)
*G11C 11/4076* (2006.01)
*H01L 25/18* (2006.01)
*H01L 25/065* (2006.01)
*H01L 27/108* (2006.01)

(52) U.S. Cl.
CPC ......... *G11C 5/063* (2013.01); *H01L 2924/0002* (2013.01); *G11C 5/02* (2013.01); *H01L 2225/06541* (2013.01); *H01L 2924/14* (2013.01); *H01L 27/108* (2013.01); *G11C 11/4093* (2013.01); *G11C 11/4076* (2013.01); *H01L 25/18* (2013.01); *H01L 2924/3011* (2013.01); *H01L 25/0657* (2013.01); *H01L 2924/19043* (2013.01)
USPC ................ 365/63; 365/51; 257/686; 257/777

(58) Field of Classification Search
CPC ....................................................... G11C 5/06
USPC ........................................................ 365/63
See application file for complete search history.

(56) References Cited

U.S. PATENT DOCUMENTS

| 5,579,207 A | 11/1996 | Hayden et al. |
| 6,109,929 A | 8/2000 | Jasper |
| 6,115,278 A | 9/2000 | Deneroff et al. |

(Continued)

FOREIGN PATENT DOCUMENTS

| JP | 2003-110086 A | 4/2003 |
| JP | 2004-095799 A | 3/2004 |

(Continued)

*Primary Examiner* — Son Mai
(74) *Attorney, Agent, or Firm* — Sughrue Mion, PLLC

(57) ABSTRACT

In a semiconductor device of a stacked structure type having a control chip and a plurality of controlled chips, wherein the control chip allocates different I/O sets to the respective controlled chips and processes the I/O sets within the same access cycle, the controlled chip close to the control chip and positioned to a lower position in the stacked structure has I/O penetrating through substrate vias connected to penetrating through interconnections. The penetrating through interconnections are extended to an upper one of the controlled chips that not use the penetrating through interconnections and, as a result, all of the penetrating through interconnections have the same lengths as each other.

20 Claims, 10 Drawing Sheets

(56) References Cited

U.S. PATENT DOCUMENTS

| | | |
|---|---|---|
| 6,535,398 B1 | 3/2003 | Moresco |
| 6,661,690 B2 | 12/2003 | Moriarty et al. |
| 6,771,515 B2 | 8/2004 | McCall et al. |
| 7,161,820 B2 | 1/2007 | Funaba et al. |
| 7,200,021 B2 * | 4/2007 | Raghuram .................. 365/51 |
| 7,282,791 B2 | 10/2007 | Funaba et al. |
| 7,468,551 B2 | 12/2008 | Lin et al. |
| 7,602,630 B2 * | 10/2009 | Janzen ..................... 365/63 |
| 7,633,147 B2 | 12/2009 | Funaba et al. |
| 7,977,781 B2 | 7/2011 | Ito et al. |
| 8,040,710 B2 * | 10/2011 | Bacha ...................... 365/63 |
| 8,116,100 B2 | 2/2012 | Saen et al. |
| 2004/0257847 A1 * | 12/2004 | Matsui et al. .............. 365/63 |
| 2009/0001543 A1 | 1/2009 | Chung |
| 2012/0134193 A1 | 5/2012 | Ide |

FOREIGN PATENT DOCUMENTS

| | | |
|---|---|---|
| JP | 2004-327474 A | 11/2004 |
| JP | 2007-194444 A | 8/2007 |
| JP | 2007-226876 A | 9/2007 |
| JP | 2008-187061 A | 8/2008 |
| JP | 2009-10311 A | 1/2009 |
| JP | 2009-164478 A | 7/2009 |
| WO | 2009/055029 A2 | 4/2009 |

* cited by examiner

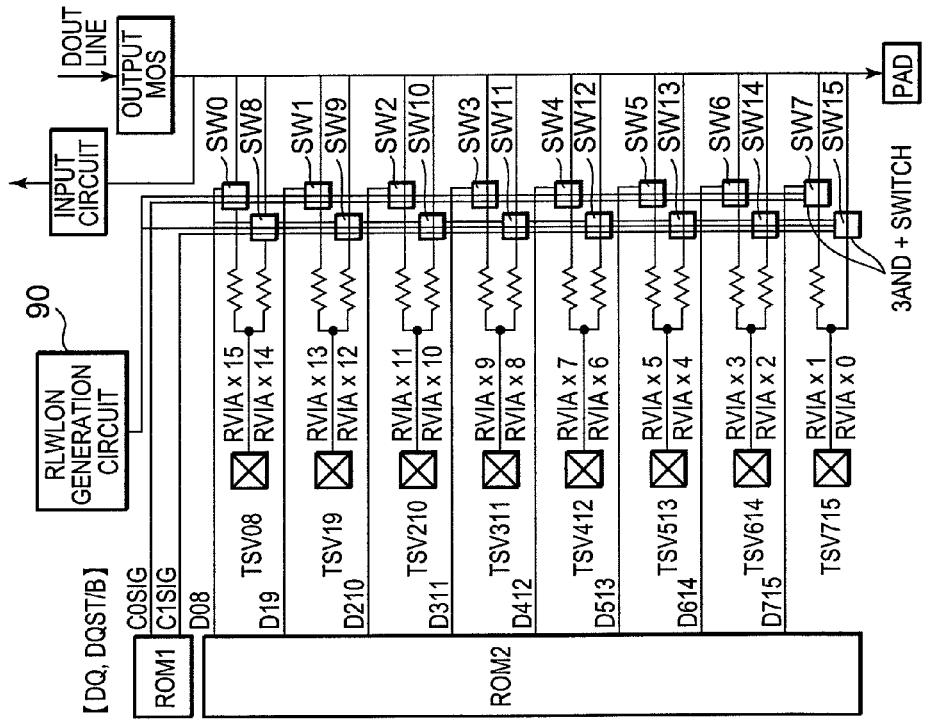
FIG. 8B
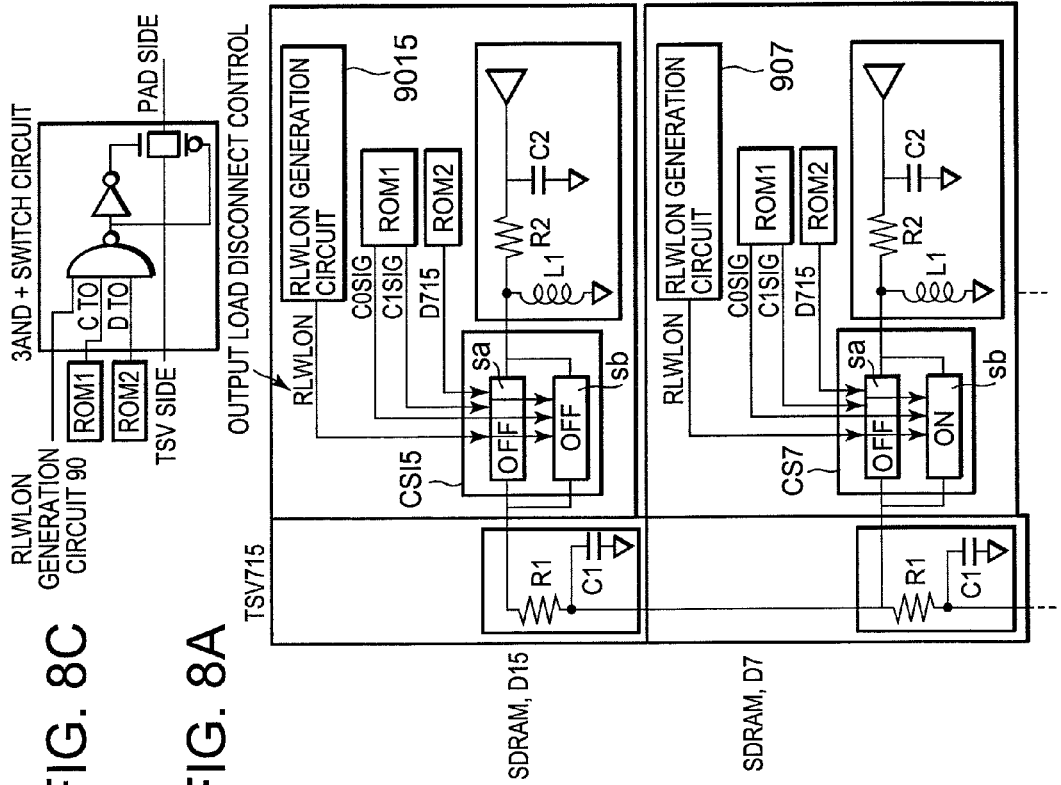
FIG. 8C
FIG. 8A

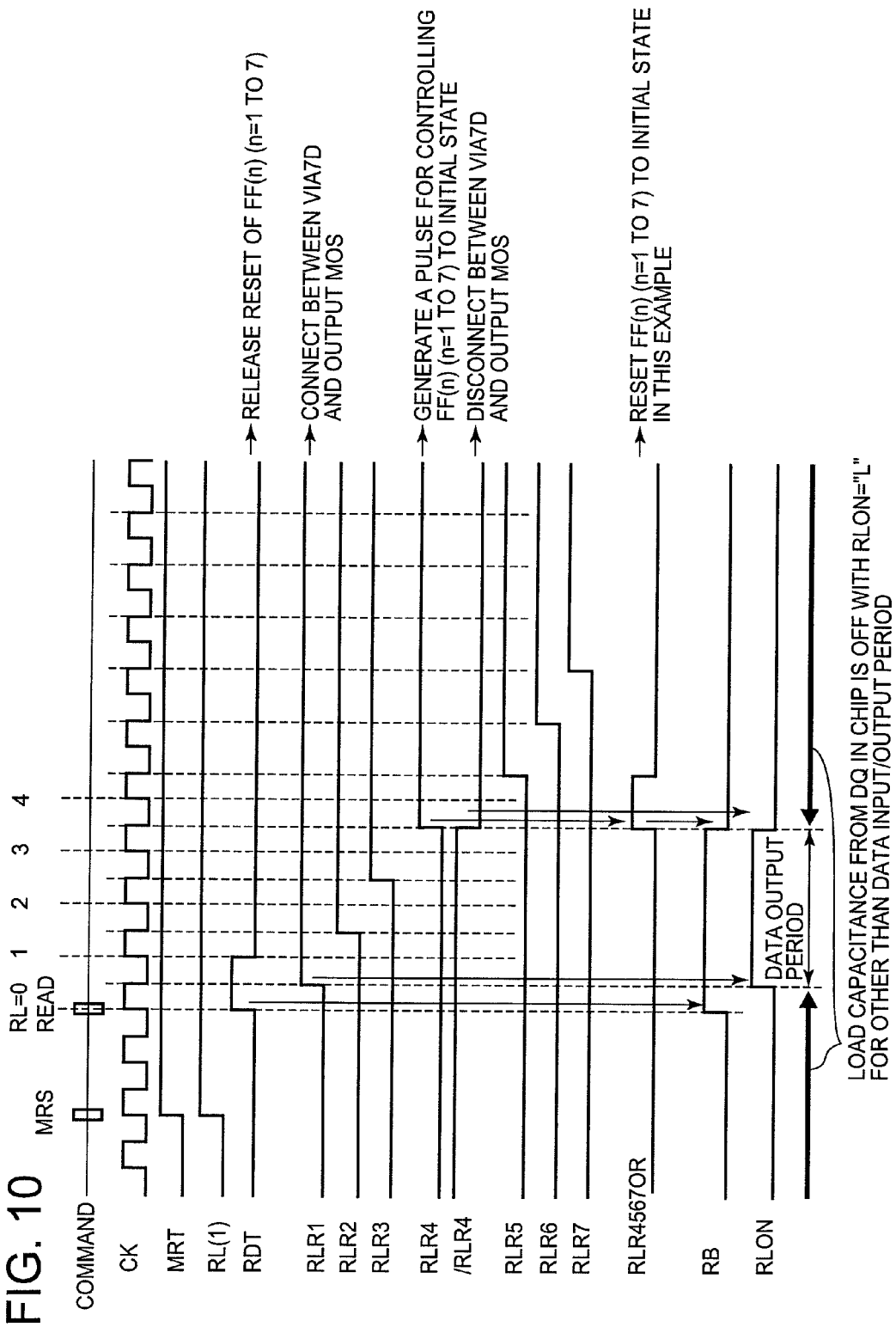

SEMICONDUCTOR DEVICE

This application is a continuation of U.S. application Ser. No. 13/653,684 filed Oct. 17, 2012, which is a continuation of U.S. application Ser. No. 12/838,028 filed Jul. 16, 2010, which is based upon and claims the benefit of priority from Japanese patent application No. 2009-176263, filed on Jul. 29, 2009, the disclosures of which are incorporated herein in its entirety their reference.

FIELD OF THE INVENTION

This invention relates to a semiconductor device incorporating DRAM or other chips and, in particular, relates to a semiconductor device formed by stacking a plurality of chips.

DESCRIPTION OF RELATED ART

As this type of a semiconductor device, JP-A-2004-327474 (Patent Document 1), which corresponds to US Patent Application Publication No. US 2004/0257847 A1, describes a semiconductor device which forms a memory module or system of a stacked structure having an interposer board, an 10 chip mounted on the interposer board, and a plurality of DRAM chips stacked together on the 10 chip. In this stacked structure, the DRAM chips and the 10 chip are connected together through penetrating through electrodes formed within via holes.

Specifically, in the DRAM chips of the memory module described in Patent Document 1, a plurality of penetrating through electrodes formed in the via holes are provided for transferring data signals and data mask signals accompanying the data signals together with interconnections which are electrically connected to the penetrating through electrodes and which are located between adjacent ones of the chips. Herein, a combination of the penetrating through electrodes and the interconnections may be called penetrating through substrate vias.

The semiconductor device of this structure is advantageous in that penetrating through substrate vias between the plurality of DRAM chips can be shortened and only the 10 chip may have a DLL which consumes a large current. Herein, it is to be noted in the instant specification that the penetrating through substrate vias formed through though-silicon via holes may be called through-silicon vias (TSVs), as may be recently used in this technical field.

JP-A-2009-10311 (Patent Document 2), which corresponds to US Patent Application Publication No. US 2009/0001543 A1, describes a stack package having a structure in which a plurality of semiconductor chips are stacked on a board and the plurality of semiconductor chips are connected together through through-silicon vias which will be abbreviated to TSV hereinbelow.

SUMMARY OF THE INVENTION

Problem to be Solved by the Invention

In the memory system described in Patent Document 1, a memory controller (chip set denoted by 402 in FIG. 38 of Patent Document 1) is provided separately from the stacked 10 chip and DRAM chips and is mounted on a motherboard. The chip set and the 10 chip are connected together through a system data bus (disclosed in Patent Document 1). Specifically, the memory system disclosed in Patent Document 1 is formed by a control chip equipped with the controller and controlled chips, such as the stacked DRAM chips and 10 chip controlled by the controller. Thus, the control chip is spatially separated from the controlled chips.

Disclosure of Patent Document 2 is directed only to the stacked package as controlled objects which are to be controlled by a controller and is never directed to a controller or a control chip that controls the controlled objects or the controlled chips.

At any rate, either Patent Document 1 or Patent Document 2 discloses or suggests nothing about a problem caused by interconnections between a control chip and controlled chips controlled by the control chip. That is, either Patent Document 1 or Patent Document 2 considers nothing about shortening interconnections between a control chip incorporating a controller and controlled chips controlled by the controller.

Means for Solving the Problem

This invention seeks to solve one or more problems caused to occur in connection with the stack package.

Effect of the Invention

According to this invention, when data signal DQ and data strobe signal DQS/B interconnections are formed by the penetrating through substrate vias, it is possible to minimize the skew between those interconnections. Further, when address, command, and clock interconnections are formed by the penetrating through substrate vias, it is also possible to minimize the skew between the address and clock interconnections and the skew between the command and clock interconnections.

Further, when the controlled chips are divided into a plurality of groups and the penetrating through substrate vias are commonly used by the controlled chips of the respective groups, it is possible to reduce the load of the interconnections as compared with the case where the penetrating through substrate vias are not commonly used.

BRIEF DESCRIPTION OF THE DRAWINGS

The above features and advantages of this invention will be more apparent from the following description of certain preferred embodiments taken in conjunction with the accompanying drawings, in which:

FIGS. 8A, 8B, and 8C are diagrams for explaining a semiconductor device according to a fourth embodiment of this invention and SDRAM chips used in the semiconductor device;

FIG. 10 is an operation waveform diagram for explaining the operation of the RLWLON generation circuit shown in FIGS. 9A and 9B.

DETAILED DESCRIPTION OF PREFERRED EMBODIMENTS

This invention will be now described herein with reference to illustrative embodiments. Those skilled in the art will recognize that many alternative embodiments can be accomplished using the teachings of this invention and that this invention is not limited to the embodiments illustrated for explanatory purposes.

Figure 1:
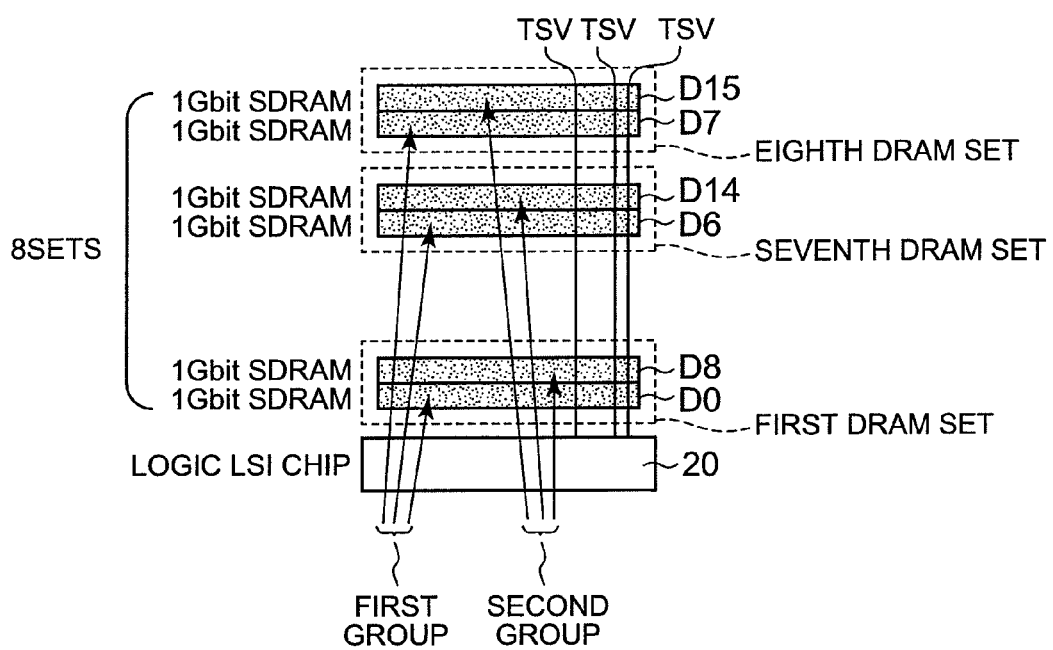
FIG. 1 is a diagram showing the theoretical structure of a semiconductor device according to a first embodiment of this invention.

Referring to FIG. 1, the theoretical structure of a semiconductor device according to a first embodiment of this invention will be described. The illustrated semiconductor device comprises a logic LSI chip 20 as a control chip and a plurality of SDRAM chips as controlled chips stacked on the logic LSI chip 20. The control chip may be also called a master chip (or active chip) while each controlled chip is a slave chip (or passive chip). For example, the semiconductor device comprising the master chip and the slave chips has a system-in-package structure in which those chips are assembled in layers and integrally packaged. The structure shown in FIG. 1 is specified by a structure obtained by combining the so-called COC (Chip On Chip) technology and TSV (Through Silicon Via) technology, as mentioned in detail with reference to FIG. 4. In the figure, external terminals (not illustrated) of the semiconductor device with the structure shown in FIG. 1 are disposed on the lower side of the logic LSI chip 20. The external terminals are connected to the logic LSI chip 20. I/O signal lines penetrating through the controlled chips, which will be described later, are connected to the logic LSI chip 20 and are not directly connected to the external terminals.

FIG. 1 shows an example in which 16 SDRAM chips D0 to D15 each having a memory capacity of 1 Gbit are stacked on the logic LSI chip 20 operable as the control chip. Each of the illustrated SDRAM is a DDR (Double Data Rate) 3 synchronous dynamic random access memory.

The 16 SDRAMs D0 to D15 are divided into a first group including the SDRAMs D0, D1, D2, ... D6, D7 and a second group including the SDRAMs D8, D9, ... D14, D15. The first and second groups are alternatively selected by a first clock signal CS0CK0 and a second clock signal CS1CK1, respectively, and each output from the control chip (master chip) 20, which will be described later. Hereinafter, the first and second groups each may also be referred to simply as a "group" or as a "chip selection group".

In the illustrated example, the SDRAMs D0 and D8 form a first DRAM set located closest to the logic LSI chip 20, then, subsequent pairs of the SDRAMs D1 and D9, D2 and D10, D3 and D11, D4 and D12, D5 and D13, D6 and D14, and D7 and D15 form second to eighth DRAM sets, respectively. As seen in FIG. 1, the SDRAM D15 of the eighth DRAM set is disposed at a position farthest from the logic LSI chip 20. The first to eighth DRAM sets are accessed in parallel by the control chip (master chip) 20 so that a data transfer rate of 51.5 Gbyte/sec is achieved, which will be described later. Hereinafter, the first to eighth DRAM sets each may also be referred to simply as a "set" or as a "DRAM set".

The SDRAMs D0 to D15 have the same penetrating through substrate vias, namely, Through-Silicon Vias (TSV) structure, i.e. the same pin structure as one another. Specifically, it is assumed that the SDRAMs D0 to D15 each have a total of 382 TSVs including 256 data signal (DQ) penetrating through substrate vias (TSVs), 32 data mask (DM) penetrating through substrate vias (TSVs), 64 data strobe signal (DQS/DQSB) penetrating through substrate vias (TSVs), 14 address penetrating through substrate vias (A0 to A13) (TSVs), 3 bank address penetrating through substrate vias (BA0 to BA2) (TSVs), 3 command signal penetrating through substrate vias (TSVs) (/RAS (RASB), /CAS (CASB), /WE (WEB)), and 10 control signal penetrating through substrate vias (TSVs) (CS0, CS1, CKE0, CKE1, CK0, CK1, /CK0, /CK1, ODT0, °DT1). It is needless to say that power supply penetrating through substrate vias (TSVs) are also provided in addition to the above-mentioned TSVs. At any rate, the term "via" or "vias" may be considered as a combination of a penetrating through electrode and an interconnection connected to the penetrating through electrode.

A data signal (DQ), a data mask signal (DM), data strobe signals (DQS/DQSB), an address (A0-A13), a bank address (BA0-BA2), command signals (/RAS (RASB), /CAS (CASB), /WE (WEB)), and control signals (CS0, CS1, CKE0, CKE1, CK0, CK1, /CK0, /CK1, ODT0, ODT1) are all well-known signals for controlling the DRAM functions. CK0, CK1, /CK0, and /CK1 are so-called system clocks for use in communication between the control chip (master chip) and the controlled chips (slave chips) and thus these chips are of the synchronous type.

Herein, the penetrating through substrate vias, namely, through-silicon vias (TSVs) each continuously penetrating through the SDRAMs D0 to D15 are 10 called continuous TSVs.

Each SDRAM has an 8-bank structure and outputs a 32-bit data signal in parallel. The 256 data signal (DQ) TSVs are each shared by the above-mentioned two groups (chip selection groups). In this case, since each DDR3 SDRAM normally gives a transfer rate of 1600 Mbps per pin, each group can achieve a data transfer rate of 1600 Mbps×32×8 (DRAM sets)=409.6 Gbit/sec=51.5 Gbyte/sec. Of the two groups (chip selection groups), the first group (first controlled chips) is communication-controlled at a first access cycle by the first chip selection signal (first clock signal CS0CK0) output from the control chip 20 while the second group (second controlled chips) is communication-controlled at a second access cycle by the second chip selection signal (second clock signal CS1 CK1) output from the control chip 20. Since the first and second groups are mutually exclusively controlled by the control chip 20 at the first and second access cycles, each of the TSVs corresponding to one I/O bit is shared by the first and second groups.

As shown by solid lines in FIG. 1, the continuous penetrating through type vias, namely, continuous type TSVs are provided each penetrating through all the SDRAMs from the SDRAM D15 to the SDRAM D0. Therefore, the continuous type TSVs respectively forming the data signal (DQ) TSVs and the data strobe signal (DQS/DQSB) TSVs are substantially equal in length to each other. Further, the continuous type TSVs respectively forming the address, command, and clock TSVs are also substantially equal in length to each other.

Figure 2:
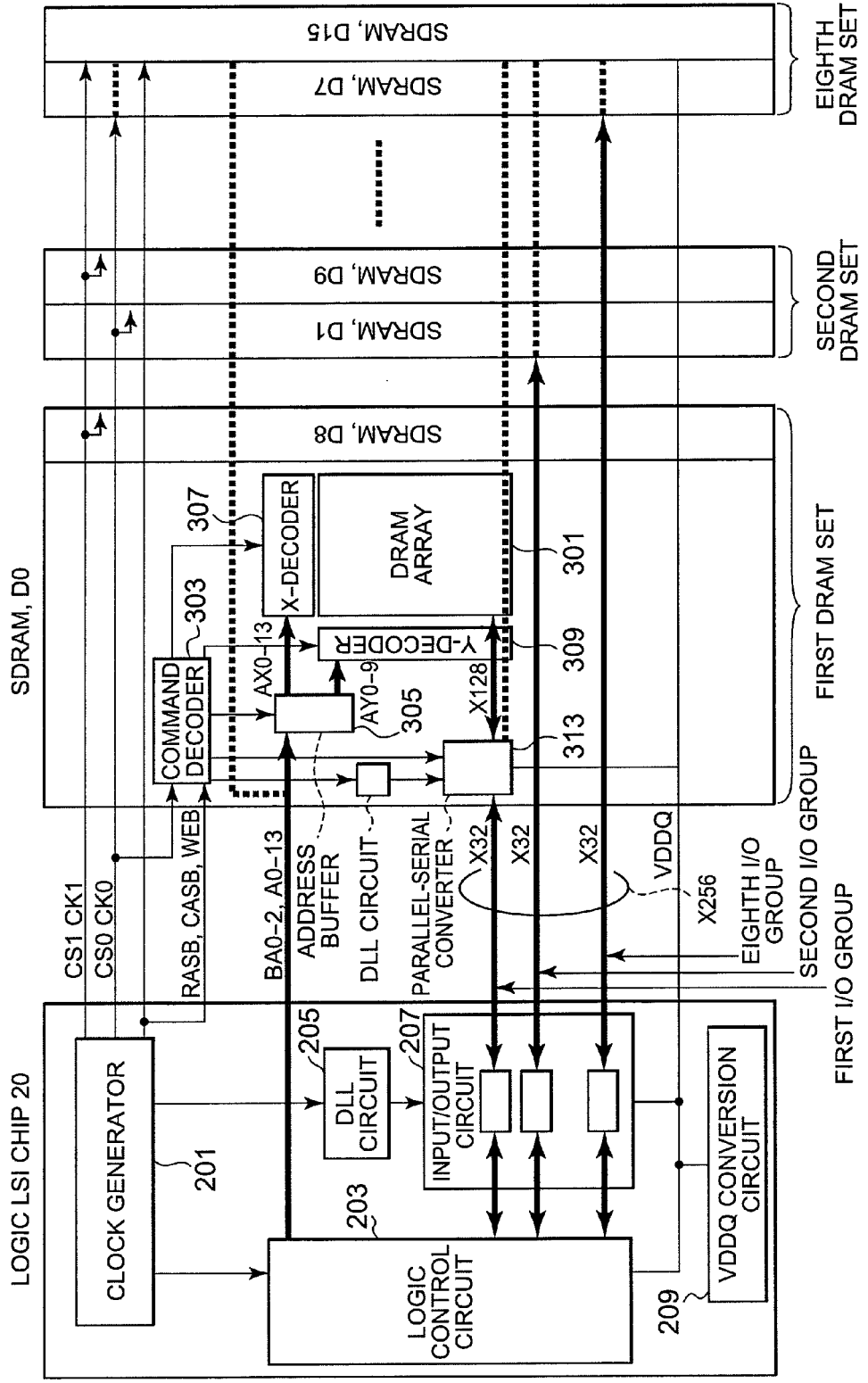
FIG. 2 is an interconnection diagram for theoretically explaining a semiconductor device according to a second embodiment of this invention.

Referring to FIG. 2, the structure of a semiconductor device according to a second embodiment of this invention is illustrated. Also in this embodiment, as in the first embodiment shown in FIG. 1, it is assumed that pairs of SDRAMs D0 and D8 to SDRAMs D7 and D15 of 8 DRAM sets are stacked on a logic LSI chip 20. It is assumed, however, that each of the SDRAMs D0 to D15 is a 2 Gbit DDR3 SDRAM.

The logic LSI chip 20 shown in FIG. 2 comprises a clock generator 201, a logic control circuit (controller) 203, a DLL circuit 205, an input/output circuit 207, and a VDDQ conversion circuit 209. From the VDDQ conversion circuit 209, a memory-driving main power supply voltage VDDQ is applied not only to the input/output circuit 207 and the logic control circuit 203 of the logic LSI chip 20, but also to the SDRAMs D0 to D15 stacked on the logic LSI chip 20.

The clock generator 201 supplies a first clock signal CS0CK0 to the SDRAMs D0 to D7 (which belong to first controlled chips) forming a first group (chip selection group) and further supplies a second clock signal CS1 CK1 to the SDRAMs D8 to D15 (which belong to second controlled chips) forming a second group (chip selection group). Further, the clock generator 201 also has a function of outputting command signals RASB, CASB, and WEB. The signals RASB, CASB, and WEB specify one command.

The first and second clock signals CS0CK0 and CS1CK1 are supplied to the SDRAMs D0 to D15 through the clock TSVs while the command signals are supplied to the SDRAMs D0 to D15 through the command TSVs. Herein, the first clock signal CS0CK0 does not need to be actually supplied to the uppermost SDRAM 15 belonging to the second group (chip selection group), but in this embodiment, as shown by a broken line in FIG. 2, the TSV for the first clock signal CS0CK0 also extends to the uppermost SDRAM 15 and, as a result, the TSV for the first clock signal CS0CK0 has substantially the same length as the TSV for the second clock signal CS1 CK1. That is, the interconnection formed by the TSV for the first clock signal CS0CK0 includes an unused and redundant interconnection portion (hereinafter referred to as an "unused and redundant interconnection") in terms of necessary connection.

The logic control circuit 203 provided in the logic LSI chip 20 outputs a 3-bit bank address signal BA0-2 and a 14-bit address signal A0-13 and operates as a controller that sends and receives data signals DQ between itself and the input/output circuit 207. The logic control circuit 203 has a function similar to that of a SSTL (Stub Series Terminated Logic) DDR controller, but this embodiment differs from the SSTL chip in that the logic LSI chip 20 having such a controller function is stacked along with the SDRAMs D0 to D15. Accordingly, the logic LSI chip 20 has electrodes electrically connected to the continuous TSVs provided in the SDRAMs D0 to D15.

Each input/output circuit 207 sends and receives 32-bit width data signals DQ between itself and the SDRAMs D0 to D15, respectively, and thus sends and receives parallel data signals DQ of 256-bit width in total. The data signal DQ is transmitted or received as an I/O data signal. The first DRAM set is allocated with a first I/O group (x32 DQ signal bits) and the second DRAM set is allocated with a second I/O group (x32 DQ signal bits). The third to eighth DRAM sets are allocated with third to eighth I/O groups, respectively. These eight I/O groups are accessed in parallel by the control chip (master chip) 20 so that the above-mentioned data transfer rate of 51.5 Gbyte/sec is achieved. That is, the DRAM sets defined by the I/O groups determine the data transfer rate. In other words, they define the transfer band width which represents the number of I/O transfer bits that are simultaneously communicated. As the number of DRAM sets increases, the transfer band width increases and thus the data transfer rate increases. As the number of I/O bits forming each I/O group increases, the transfer band width increases and thus the data transfer rate increases. On the other hand, the chip selection groups determine the memory capacity value. As the number of chip selection groups increases, the memory capacity value increases.

Therefore, in FIG. 1, it is to be noted that the number of DRAM sets stacked on the control chip (master chip) 20 represents the transfer band width while the number of chip selection groups in each DRAM set represents the storage capacity. By controlling the controlled chips of each of the first and second groups at the same access cycle, the control chip 20 communicates information of the predetermined I/O band width (256 data signal (DQ) bits, i.e. x256 I/O bits) between itself and the controlled chips.

Thus, the control ship 20 is communicable with the controlled chips of the first and the second groups by the use of the predetermined number of I/O 15 bits, namely, 256 bits in the illustrated example.

The 3-bit bank address signal BA0-2 and the 14-bit address signal A0-13 are supplied to all the SDRAMs D0 to D15 through the address TSVs.

As is clear from the above description, the TSVs for the first and second clock signals, the TSVs for the command signals, and the TSVs for the address signals are substantially equal in length to each other.

The SDRAM D0 (first DRAM set) and the input/output circuit 207 of the logic LSI chip 20 are connected to each other through the 32 data signal DQ TSVs as indicated by x32 (first I/O group) in FIG. 2. The input/output circuit 207 includes interface circuits such as buffers corresponding to the SDRAM chips, respectively, so that data signals DQ are sent and received between the SDRAM D0 and the logic control circuit 203 through the corresponding interface circuit. Each interface circuit may have a parallel-serial conversion circuit. The data signal DQ TSVs between the SDRAM D0 and the logic LSI chip 20 pass through the SDRAMs D8, D1, D9, . . . , D14, D7 to extend to the uppermost SDRAM D15, thereby forming the continuous type TSVs. This means that the data signal DQ TSVs for the SDRAM D0 each include an unused and redundant interconnection from the SDRAM D1 (second DRAM set) to the SDRAM D15 (eighth DRAM set). As will be described later, the data signal DQ TSVs for the SDRAM D0 are also used by the SDRAM D8 (first DRAM set). That is, the data signal DQ TSVs for the SDRAM D0 are commonly used by the first DRAM set (SDRAM D0 and SDRAM D8). Specifically, the logic LSI chip 20 and the SDRAM D0 are connected to each other through first data signal DQ TSVs and the SDRAM D0 and the SDRAM D8 are connected to each other through second data signal DQ TSVs electrically identical to the first data signal DQ TSVs. The above-mentioned unused and redundant interconnections or vias related to the first DRAM set extend to the other DRAM sets (second to eighth DRAM sets). However, the data signal DQ TSVs (x32) used by the first DRAM set are not used by the second to eighth DRAM sets and thus are unused and redundant interconnections for those DRAM sets in terms of necessary connection.

Likewise, the data signal DQ TSVs (second I/O group) for the SDRAM D1 (second DRAM set) also extend from the input/output circuit 207 of the logic LSI chip 20 to the SDRAM D15 through the SDRAMs D0, D8, D1, D9, . . . , D7. Therefore, it is seen that the data signal DQ TSVs for the SDRAM D1 include unused and redundant interconnections corresponding to the first and third to eighth DRAM sets. This applies to the subsequent SDRAMs. The data signal DQ TSVs for the SDRAM D7 are provided between the input/output circuit 207 of the logic LSI chip 20 and the SDRAM D7. The data signal DQ TSVs for the SDRAM D7 are also formed by 32 TSVs and are commonly used by the SDRAMs D7 and D15. In this manner, all the data signal DQ TSVs form the continuous type TSVs connected between the logic LSI chip 20 and the uppermost SDRAM D15 and are substantially equal in length to each other.

Herein, taking the SDRAM DO as an example, the structure of the SDRAM chip used in this embodiment will be described. The illustrated SDRAM DO comprises, in addition to the above-mentioned TSVs, a DRAM array 301 having a memory capacity of 2 Gbit, a command decoder 303, an address buffer 305, an X-decoder 307, a Y-decoder 309, a DLL circuit 311, and a parallel-serial conversion circuit 313.

The command decoder 303 of the SDRAM DO belonging to the first group (chip selection group) decodes command signals RASB, CASB, and 10 WEB sent from the logic LSI chip 20.

On the other hand, a bank address signal BAO-2 and an address signal A0-13 from the logic control circuit 203 are given to the address buffer 305. The address buffer 305 outputs address signals AXO-13 and AYO-9 to the X-decoder 307 and the Y-decoder 309, respectively. In response to the address signals AXO-13 and AYO-9 given to the X- and Y-decoders 307 and 309, the DRAM array 301 inputs and outputs 128-bit ($^x128$) data signals in parallel between itself and the parallel-serial conversion circuit 313. The input/output operations of the 128-bit data signals are performed under the control of a command from the command decoder 303 and clocks from the DLL circuit 311.

The parallel-serial conversion circuit 313 sends and receives x128-bit parallel data signals between itself and the DRAM array 301 and further sends and receives 32-bit ($^x32$) parallel data signals between itself and the logic LSI chip 20. That is, the parallel-serial conversion circuit 313 has a function to convert a $^x128$-bit data signal into $^x32$-bit data signals and to convert x32-bit data signals into a x128-bit data signal.

In the illustrated structure, since the data signal DQ and data strobe signal DQS/B TSVs for all the DRAM sets corresponding to the respective I/O groups can be made substantially equal in length to each other, the skew between data signals DQ and data strobe signals DQS/B can be minimized. This structure (equi-length interconnections) is very important in the stacked structure in which the plurality of DRAM sets are stacked in sequence with respect to the controller chip. This is because, in this embodiment, each I/O group is formed by $^x32$ DQ signal bits and the controller chip can perform communication control of the plurality of I/O groups ($^x256$ DQ signal bits) with a single synchronization signal and with high accuracy. Since the address, command, and clock signal TSVs can also be made substantially equal in length to each other, it is also possible to minimize the skew between address and clock signals and between command and clock signals.

As described above, according to the first and second embodiments of this invention, it is possible to form a semiconductor device in which a control chip (logic LSI chip 20 in FIGS. 1 and 2) and a plurality of controlled chips (SDRAM chips in FIGS. 1 and 2) are stacked together by the use of the so-called TSV technology.

Herein, consideration is given to the case where two controlled chips are stacked on a control chip and are connected to the control chip through penetrating through substrate vias, namely, through-silicon vias (TSVs).

For example, a first chip is assumed to be a control chip (master chip) and a second chip (first DRAM set) and a third chip (second DRAM set) are assumed to be controlled chips (slave chips). In addition, it is assumed that the second and third chips are stacked in this order on the first chip. First, communications (read/write) of respective I/O groups are performed between the first control chip and the second and third controlled chips. In this event, the distance (first impedance) of a signal line connected between respective circuits of the first control chip and the second controlled chip differs from the distance (second impedance) of a signal line connected between respective circuits of the first control chip and the third controlled chip so that there are differences in signal arrival time and reflected wave quantity (using the respective chips as references).

Taking this into account, in the first and second embodiments, it is pointed out that the first and second impedances can be made substantially equal to each other by setting the distance of the signal line between the first control chip and the second controlled chip to be equal to the distance of the signal line between the first control chip and the third controlled chip.

It is preferable to take into account that, practically, signal lines formed by through-silicon vias (TSVs) are not necessarily made equal in impedance to each other due to manufacturing variations in manufacturing processes (TSV forming process, bump forming process, and TSV-bump connection process). That is, TSVs formed in different manufacturing processes may have different impedances due to manufacturing variations in the manufacturing processes.

Further, it is also preferable to expect that when a plurality of signal lines are formed by a plurality of TSVs, the impedance of each signal line may be different from those of the others due to variations of inherent manufacturing processes.

Moreover, it is also preferable to take into account that it may be necessary to individually adjust ODTs (On-Die Terminations), i.e. termination resistances, connected on respective SDRAM chips depending on manufacturing variations.

On the other hand, in the case of a well-known surface mount type module different from the stacked type semiconductor device according to this invention, it is usual to form, in the same process, interconnections between a plurality of chips in a module board. That is, in the surface mount type module, it is not necessary to consider the difference in impedance due to the difference in manufacturing process. For example, in the surface mount type module, a plurality of interconnections in the module board and a plurality of interconnections in the chips are simultaneously formed in the same process. Therefore, for example, if the interconnections are narrowed due to manufacturing variations, the impedances of all the interconnections uniformly change in the same direction and thus it is not necessary to consider the difference in impedance between interconnections that are formed in different manufacturing processes.

Figure 3:
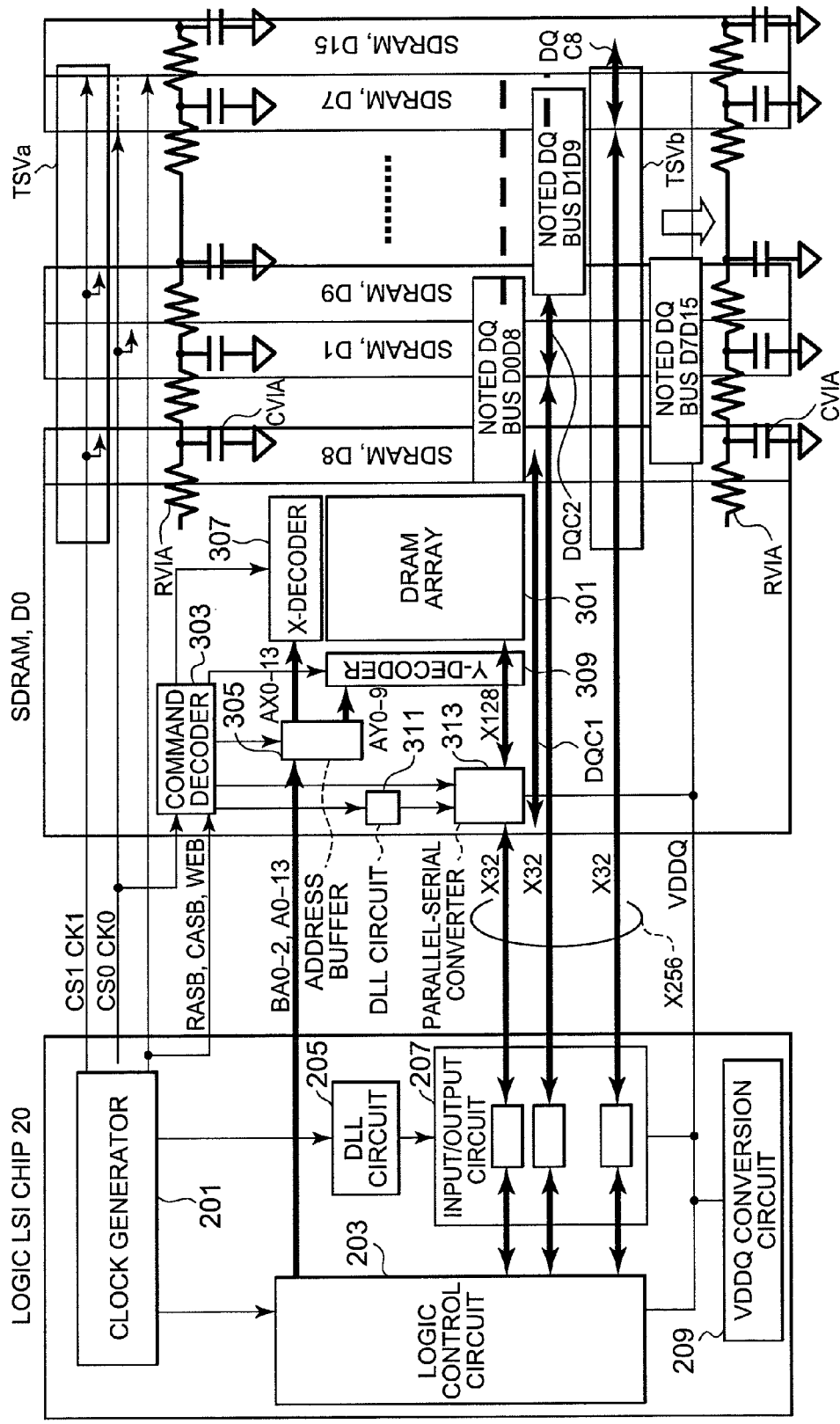
FIG. 3 is a diagram for explaining the interconnection impedance according to the second embodiment of this invention.

Referring to FIG. 3, there are shown interconnection impedances in the semiconductor device according to the second embodiment of this invention. Herein, the interconnection impedances in a through-silicon via (TSVa) for the second clock signal CS1CK1 and a data signal DQ TSVb for the SDRAM D15 are exemplarily illustrated. The illustrated interconnection impedances are respectively given by penetrating through electrode resistances RVIA and capacitances CVIA in the TSVa for the second clock signal CS1CK1 and the data signal DQ TSVb for the SDRAM D15. In FIG. 3, in order to simplify the explanation, the penetrating through electrode resistances RVIA and the capacitances CVIA in the TSVa for the second clock signal CS1 CK1 and the data signal DQ TSVb for the SDRAM D15 are shown to be equal to each other. When paying attention to the TSVa for the second clock signal CS1CK1, an equivalent circuit thereof can be given by penetrating through electrode resistances RVIA connected in series from the SDRAM DO to the SDRAM D15 and a plurality of capacitances CVIA each connected between the adjacent penetrating through electrode resistances RVIA.

A TSV DQC1 being part of the data signal DQ TSV for the SDRAMs D0 and D8 is shared by the SDRAMs D0 and D8. Likewise, a TSV DQC2 being part of the data signal DQ TSV for the SDRAMs D1 and D9 is shared by the SDRAMs D1 and D9. Further, a TSV DQC8 is shared by the SDRAMs D7 and D15. Herein, an equivalent circuit of the data signal DQ TSVb including as its part the shared penetrating through electrode DQC8 can be given by a series circuit having penetrating through electrode resistances RVIA connected in series from the SDRAM D0 to the SDRAM D15 and a plurality of capacitances CVIA each connected between the adjacent penetrating through electrode resistances RVIA. The penetrating through electrode capacitance CVIA is actually about 60 pF.

As is clear from FIG. 3, the SDRAM chip located closer to the logic LSI chip 20 has a smaller penetrating through resistance while the SDRAM chip located farther from the logic LSI chip 20 has a larger penetrating through resistance. Further, these penetrating through resistances slightly have variations due to the difference in manufacturing process.

Figure 4:
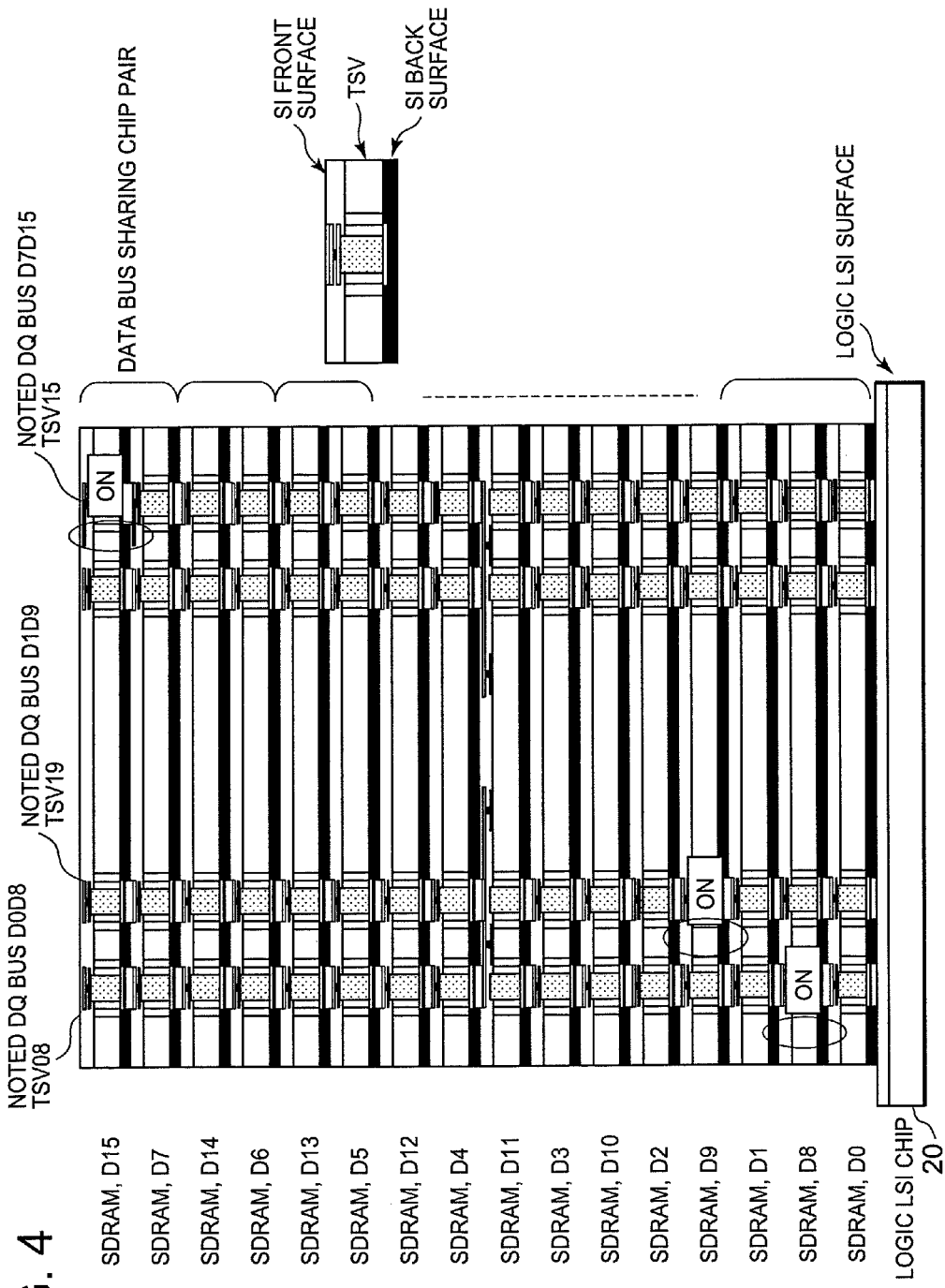
FIG. 4 is a diagram showing the three-dimensional structure of the semiconductor device shown in FIGS. 2 and 3.

Referring to FIG. 4, the structure of the semiconductor device shown in FIGS. 2 and 3 will be described in more detail. Herein, the structure of the data signal DQ TSVs is mainly illustrated and, as is clear from FIG. 4, these TSVs form the continuous type TSVs, respectively. As shown in FIG. 4, the 16 SDRAMs D0, D8, D1, D9, D2, D10, D3, D11, D4, D12, D5, D13, D6, D14, D7, and D15 are stacked in this order on the logic LSI chip 20. The SDRAMs D0 to D7 form the first group (first chip selection group) and the SDRAMs D8 to D15 form the second group (second chip selection group). The adjacent two SDRAMs of the first and second groups, such as, for example, the SDRAMs D0 and D8, D1 and D9, or D7 and D15, form a SDRAM pair or set (n-th DRAM set) sharing the corresponding data signal DQ TSVs, i.e. corresponding buses (n-th I/O group).

In order to clarify the above-mentioned sharing relationship, in FIG. 4, a single data signal DQ TSV shared by the SDRAMs D0 and D8 of the first DRAM set is given by TSV08 (first I/O set), a single data signal DQ TSV shared by the SDRAMs D1 and D9 of the second DRAM set is given by TSV19 (second I/O set), and a single data signal DQ TSV shared by the SDRAMs D7 and D15 of the eighth DRAM set is given by TSV715 (eighth I/O set). As enlargedly shown on the right side in FIG. 4, the upper side and the lower side in the figure of each SDRAM chip are silicon (Si) front and back surfaces, respectively, and through-silicon vias TSVs have penetrating through interconnections between the front and the back surfaces and electrodes formed on the front and back surfaces.

As seen from FIG. 4, all the data signal DQ TSVs have the same length if there is no variation in manufacturing processes and so on. Further, the data signal DQ TSV08 includes a portion shared by the SDRAMs D0 and D8 and, in this connection, circuits formed at the front surfaces of the SDRAMs D0 and D8 and the data signal DQ TSV08 are in a conductive state (i.e. on state). On the other hand, the SDRAMs other than the SDRAMs D0 and D8 and the data signal DQ TSV08 are in a non-conductive state (i.e. off state).

Likewise, the data signal DQ TSV19 and circuits formed at the front surfaces of the SDRAMs D1 and D9 are in a conductive state (i.e. on state) while the data signal DQ TSV19 is not electrically connected to the SDRAMs other than the SDRAMs D1 and D9. Further, the data signal DQ TSV715 and circuits formed at the front surfaces of the SDRAMs D7 and D15 are in a conductive state (i.e. on state).

From this fact, it should be understood that the controlled chips specified by the SDRMS D0 to D15 are divided into a first set or group D0 to D7 and a second set or group D8 to D15 and that the first set of the controlled chips D0 to D7 has first ones of the penetrating through substrate vias (namely, through-silicon vias) that are used for performing communication between the control chip and the controlled chips of the first set and second ones of the penetrating through substrate vias that are used for performing communication between the control chip and the controlled chips of the second set. Likewise, the second set of the controlled chips comprises third ones of the penetrating through substrate vias that are used for performing communication between the control chip and the controlled chips of the second set and fourth ones of the penetrating through substrate vias which are used for performing communication between the control chip and the controlled chips of the first set.

Moreover, it is to be noted that the first ones of the penetrating through substrate vias and the fourth ones of the penetrating through substrate vias are connected to each other and are connected to first ones of the nodes of the control chip corresponding to the first I/O group, to thereby structure a first interconnection. Likewise, the second ones of the penetrating through substrate vias and the third ones of the penetrating through substrate vias are connected to each other and are connected to second ones of the nodes of the control chip corresponding to the second I/O group, to thereby structure a second interconnection. As a result, the first interconnection and the second interconnection are substantially equal in length to each other within the stacked structure. This means that the first ones of the penetrating through substrate vias and the fourth ones of the penetrating through substrate vias are arranged at first coordinate positions placed at the same positions on coordinate defined on the respective controlled chips. Similarly, the second ones of the penetrating through substrate vias and the third ones of the penetrating through substrate vias are arrange at second coordinate positions placed at the same positions on coordinate defined on the respective controlled chips. At any rate, the first and the second interconnections form first and second continuous penetrating through type conductors which are perpendicular and straight to the first and the second nodes of the control chip.

Figure 5:
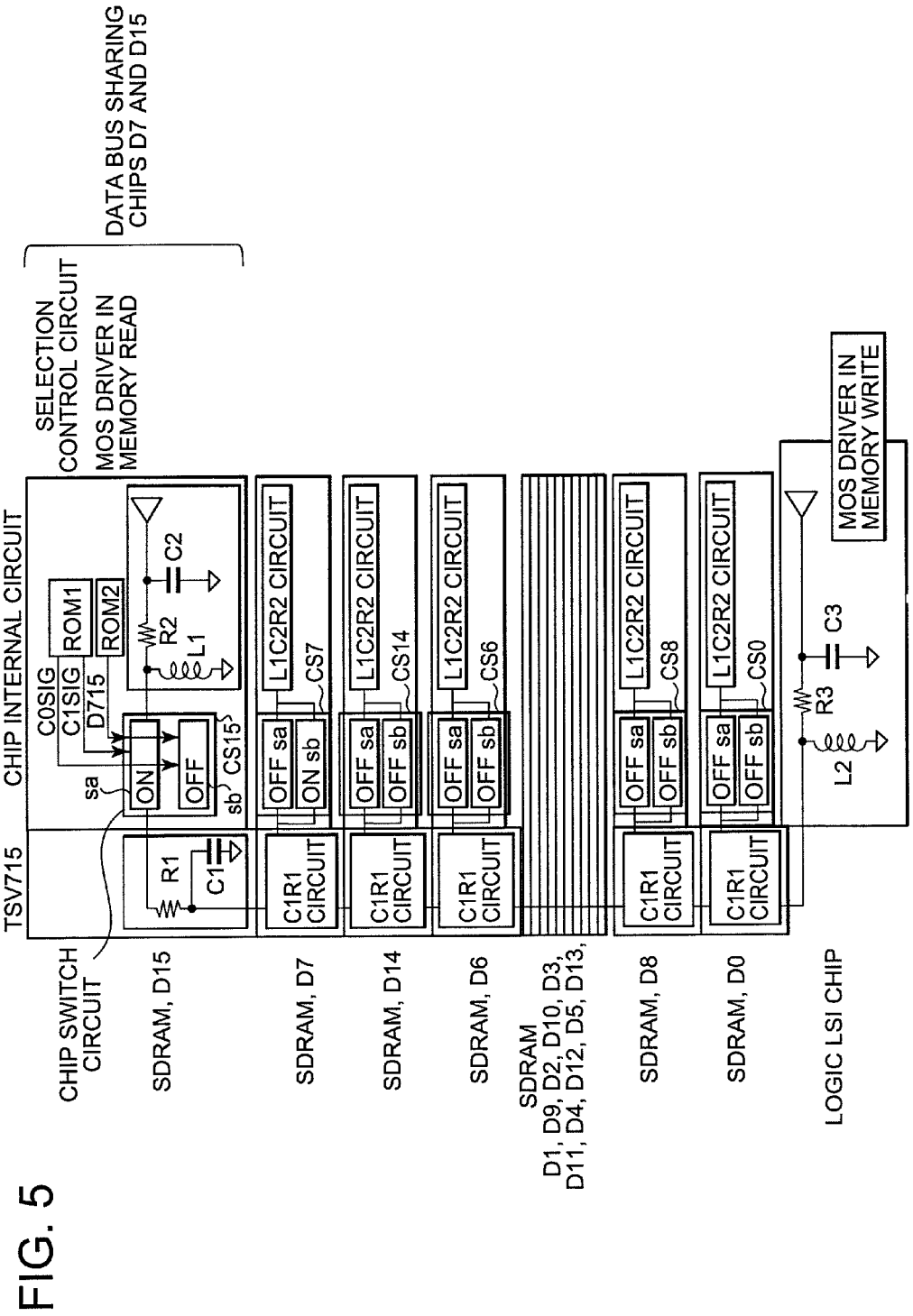
FIG. 5 is an equivalent circuit diagram of the semiconductor device shown in FIG. 4, wherein an equivalent circuit at a specific data signal penetrating through via portion is shown.

Referring now to FIG. 5, there is shown an equivalent circuit for specifically explaining the data signal D0 TSV715 and circuits related to TSV715 in the semiconductor device shown in FIG. 4. Herein, the semiconductor device according to the second embodiment of this invention is illustrated and, in this connection, it is assumed that the SDRAMs D0 to D15 include chip switch circuits CS0 to CS15, respectively, for the single data signal DQ TSV715 and that the chip switch circuits CS15 to CS0 each include later-described compensation resistances.

The chip switch circuits CS15 to CS0 each include two switch elements sa and sb each for determining an on/off state with respect to the data signal DQ TSV715. These two switch elements sa and sb are controlled by a first ROM1 and a second ROM2. For the sake of simplification, a description will be given assuming that the first ROM1 and the second ROM2 are provided commonly for all the SDRAMs D0 to D15, but each SDRAM may be provided with a first ROM1 and a second ROM2.

Herein, the DRAM set of the SDRAMs D15 and D7 sharing the data signal DQ TSV715 will be explained. The first ROM1 outputs first and second group indication signals C0SIG and C1 SIG indicative of the first and second groups (chip selection groups), respectively. The second ROM2 outputs a set indication signal (D715 for the SDRAM D15) indicative of a SDRAM pair forming a set (n-th DRAM set).

In the chip switch circuit CS15 of the SDRAM D15 shown in FIG. 5, the switch sa which is given the set indication signal D715 and the second group indication signal C1SIG is put in an on (conductive) state. During the on state of the switch sa, the switch sb which is given the set indication signal D715 and the first group indication signal C0SIG is in an off (nonconductive) state.

On the other hand, in the chip switch circuit CS7 of the SDRAM D7, conversely to the SDRAM D15, the switch sa which is given the set indication signal D715 and the second group indication signal C1SIG is put in an off state. During the off-state of the switch sa, the switch sb given the set indication signal D715 and the first group indication signal C0SIG is in an on state.

The other SDRAMs D0 to D6 and D8 to D14 given a logic "0" level as the set indication signal D715 are all in an off state and, as a result, the SDRAMs D15 and D7 can selectively send or receive a data signal DQ to or from the logic LSI chip 20 through the data signal DQ TSV715. In this manner, it is seen that the TSV715 is shared by the SDRAMs D15 and D7.

In the illustrated example, the description has been given assuming that the first ROM1 and the second ROM2 generate the above-mentioned group and set indication signals collectively for all the SDRAMs D15 to D0. However, as described above, each SDRAM may be provided with the first ROM1 and the second ROM2. The group indication signal is a typical example of a chip selection group indication signal and the set indication signal is a typical example of a DRAM set indication signal.

In FIG. 5, an equivalent circuit inside the SDRAM D15 is shown and it is assumed that the other SDRAMs D0 to D14 are each given by the same equivalent circuit as the SDRAM D15. In this connection, the equivalent circuits of the SDRAMs D0 to D14 are expressed only by circuit elements.

The illustrated equivalent circuit inside the SDRAM D15 comprises an interconnection resistance R2 in the chip, a chip internal capacitance C2 such as a capacitance due to pads (pads in FIGS. 6A to 6C) in the chip and an interconnection capacitance, and an interconnection inductance LI. In this example, the other SDRAMs D0 to D14 are each expressed by the same equivalent circuit comprising an interconnection resistance R2, a chip internal capacitance C2, and an interconnection inductance L2. The pads are so-called probing pads mainly used when a wafer test of the single chip is conducted before an assembly process of stacking the plurality of chips with the TSV electrodes.

Like in the above-mentioned example, the data signal DQ TSV715 is shown to have penetrating through electrode resistances RVIA and penetrating through capacitances CVIA also at the SDRAM portions other than at the SDRAMs D15 and D7.

On the other hand, in FIG. 5, the logic LSI chip 20 is also expressed by an equivalent circuit. The equivalent circuit of the logic LSI chip 20 comprises an interconnection resistance R3 in the logic LSI chip 20, a capacitance C3 such as an interconnection capacitance, and an interconnection inductance L2. The illustrated equivalent circuit of the logic LSI chip 20 is given by the impedance of a MOS driver in memory write. Preferably, the logic LSI chip 20 further has a compensation impedance for impedance adjustment.

Figure 6A:
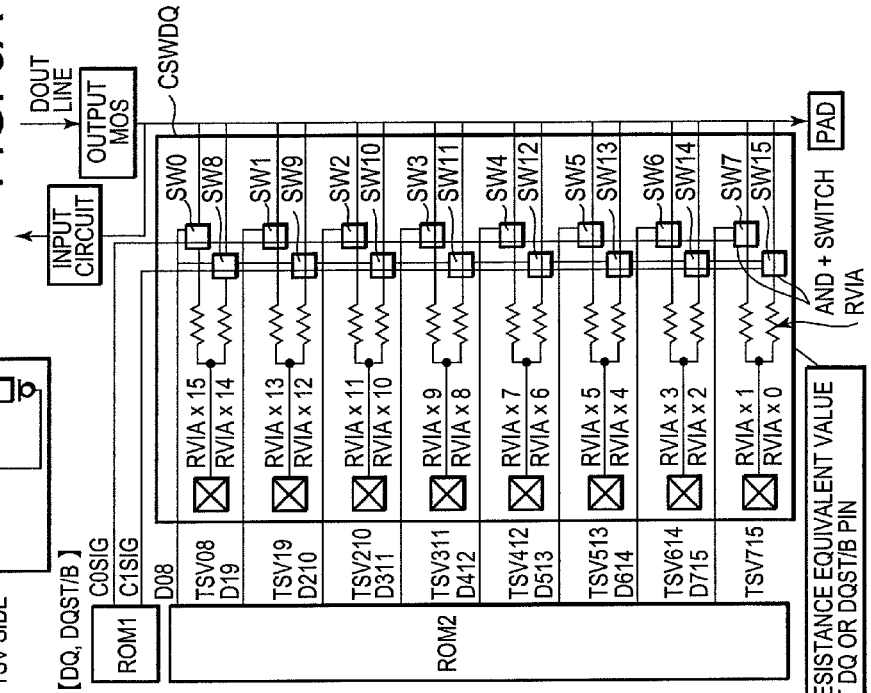
FIGS. 6A, 6B, and 6C are diagrams more specifically showing the structure of a SDRAM chip used in the semiconductor device shown in FIG. 5.

Referring now to FIG. 6A, the SDRAM chips forming the semiconductor device shown in FIG. 5 will be described in more detail. Herein, there is shown a plan view of one of the stacked SDRAMs D0 to D15 (e.g. the SDRAM D15). This structure is the same in the other SDRAM chips.

A chip switch circuit CS (index omitted) of the SDRAM chip shown in FIG. 6A includes pairs of switch elements SW0 and SW8, SW1 and SW9, SW2 and SW10, SW3 and SW11, SW4 and SW12, SW5 and SW13, SW6 and SW14, and SW7 and SW15 that are provided corresponding to the shared data signal DQ TSVs, i.e. the continuous type TSV08, TSV19, TSV210, TSV311, TSV412, TSV513, TSV614, and TSV715, respectively. These pairs of switch elements SW0 and SW8, SW1 and SW9, SW2 and SW10, SW3 and SW11, SW4 and SW12, SW5 and SW13, SW6 and SW14, and SW7 and SW15 correspond to the switch elements sa and sb provided in the chip switch circuits CS15 to CS0 shown in FIG. 5 although FIG. 5 shows the switch elements sa and sb corresponding only to the continuous TSV715.

Figure 6C:
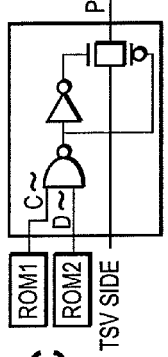
Figure 6B:
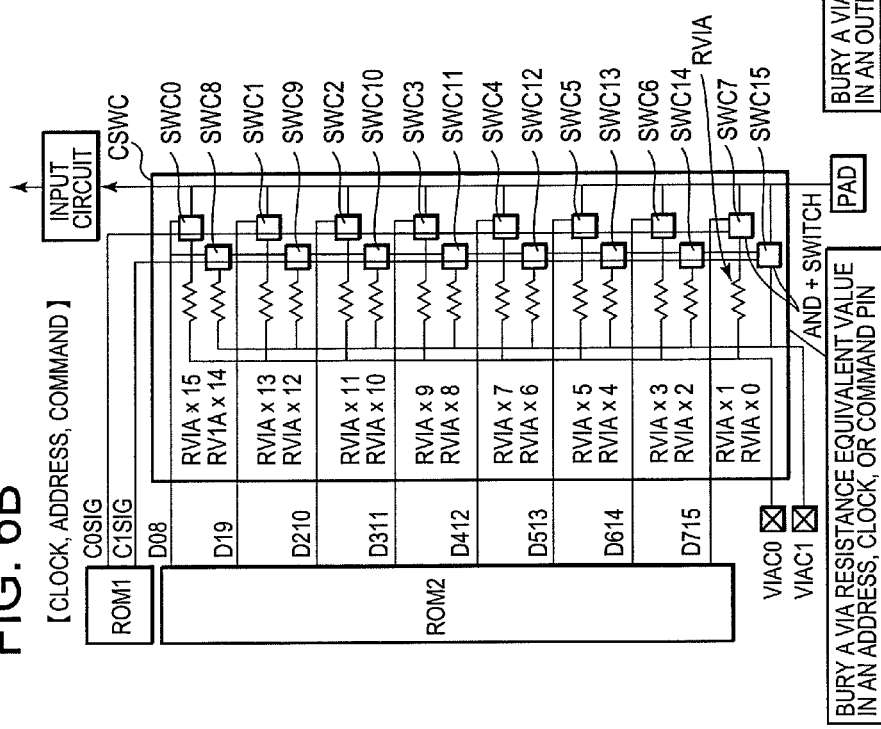

The SDRAM chip shown in FIG. 6A further includes a first ROM1 and a second ROM2 and has a function to compensate for phase variations among the data signal DQ TSVs. Specifically, FIG. 6A shows the connection relationship between the data signal DQ TSV08 to TSV715 and the switch elements SW0 to SW15 while FIG. 6B shows the connection relationship between control signal CS0/1 TSVs (herein denoted by VIAC0 and VIAC1, respectively) and switch elements SWC0 to SWC15. Further, FIG. 6C shows the structure of each of the switch elements SW0 to SW15 and SWC0 to SWC15. In FIG. 6A, the switch elements SW0 to SW15 respectively connected to the data signal DQ TSV 08 to TSV 715 on each SDRAM chip are collectively given as a chip switch circuit portion CSWDQ while, in FIG. 6B, the switch elements SWC0 to SWC15 respectively connected to the control signal CS0/1 TSVs VIAC0 and VIAC1 on each SDRAM chip are collectively given as a chip switch circuit portion CSWC.

The data signal DQ TSV08 provided on the upper side in FIG. 6A is a penetrating through electrode shared by the SDRAMs D0 and D8 located closest to the logic LSI chip 20 and the TSVs provided lower in FIG. 6A are penetrating through electrodes shaped by the SDRAM chips located farther from the logic LSI chip 20. Accordingly, the data signal DQ TSV715 provided at the lowermost position in FIG. 6A is a penetrating through electrode shaped by the SDRAMs D7 and D15 provided at the uppermost position in FIG. 4. In other words, the data signal DQ TSV08 is required to be set in an on state only at the SDRAMs D0 and D8 and likewise the data signal DQ TSV715 is required to be set in an on state only at the SDRAMs D7 and D15.

On the upper side in FIG. 6B, there are shown the switch elements SWC0 and SWC8 that are put into an on state in circuits connected to the SDRAMs D0 and D8 and located closest to the logic LSI chip 20 while, at the lowermost position, there are shown the switch elements SWC7 and SWC15 that are put into an on state in circuits connected to the SDRAMs D7 and D15 and located farthest from the logic LSI chip 20. The switch elements SWC0 to SWC15 are selectively put into an on state according to first and second group indication signals C0SIG and C1SIG from the first ROM1 and set indication signals D08 to D715 from the second ROM2 and a control signal CS0/1 is supplied to the respective SDRAM chips through either one of the through-silicon vias (TSVs) VIAC0 and VIAC1 and the selected switch elements. An output MOS transistor and an input circuit shown in FIG. 6A are so-called I/O circuits (internal circuits) and, in the case of DRAM DQ, a memory cell is connected through the output MOS transistor and the input circuit. An input circuit shown in FIG. 6B is a so-called interface input circuit for transmitting a clock, address, or command signal or the like to a logic circuit in the chip. FIG. 6A will be explained in more detail. First and second group indication signals C0SIG and CI SIG are given from the first ROM1 to the chip switch circuit portions CSWDQ of the SDRAMs forming the respective groups (chip selection groups) and set indication signals D08 to D715 are given from the second ROM2 to the chip switch circuit portions CSWDQ of the SDRAM pairs forming the respective sets (DRAM sets). In this example, when the first and second group indication signals COSIG and C1SIG are output to the SDRAM chips belonging to the respective groups (chip selection groups), i.e. output to the selected SDRAM chips, the first and second group indication signals COSIG and C1SIG take a logic "1" level. The set indication signal takes a logic "1" level in the case of the selected set (selected DRAM set) while takes a logic "0" level in the case of the non-selected set (non-selected DRAM set).

When the SDRAM chip shown in FIG. 6A is used as any one of the SDRAMs D0 to D7 forming the first group (first chip selection group), a logic "1" level is given as the first group indication signal COSIG from the first ROM1 to the switch elements SW0 to SW7 provided in the chip switch circuit portion CSWDQ.

On the other hand, when the SDRAM chip shown in FIG. 6A is used as any one of the SDRAMs D8 to D15 forming the second group (second chip selection group), a logic "1" level is given as the second group indication signal C1SIG from the first ROM1 to the switch elements SW8 to SW15 provided in the chip switch circuit portion CSWDQ.

Further, when the SDRAM chip shown in FIG. 6A is used as either one of the SDRAM chip pair, for example, the SDRAMs D15 and D7, forming the set (DRAM set), the set indication signal D715 of logic "1" is given to the switch elements SW15 and SW7 from the second ROM2. Likewise, when used as either one of the SDRAMs D14 and D6, the set indication signal D614 of logic "1" is given to the switch elements SW14 and SW6. This applies to the subsequent SDRAM pairs. When used as either one of the SDRAMs D8 and D0, the set indication signal D08 of logic "1" is given to the switch elements SW8 and SW0.

Referring to FIG. 6C, the structure of the above-mentioned switch elements SW0 to SW15 will be described. As is clear from FIG. 6C, the switch elements SW0 to SW15 each comprise a NAND gate that outputs NAND of a group indication signal (given by C) from the first ROM1 and a set indication signal (given by D) from the second ROM2, an inverter that inverts a NAND gate output, and a CMOS switch formed by CMOS transistors that receive the NAND gate output and an inverter output. The CMOS switch is turned on when the group indication signal C and the set indication signal D both take a logic "1" level. In this example, when the CMOS switch is in the on state, it operates to send an output from the penetrating through electrode side to a pad of the SDRAM.

Herein, it is assumed that the SDRAM chip shown in FIG. 6A is used as the SDRAM D15 and that each of the switch elements SW0 to SW15 has the structure shown in FIG. 6C.

In this case, as shown in FIG. 6A, the second group indication signal C1SIG of logic "1" and the set indication signal D715 of logic "1" are given to the switch element SW15 in the SDRAM D15 of the second group (second chip selection group). Therefore, the switch element SW15 is put into an on state. On the other hand, among the other switch elements SW0 to SW14, the switch elements SW0 to SW7 given the first group indication signal COSIG of logic "0" are in an off state and, further, the switch elements SW8 to SW14 given the set indication signals D08 to D614 of logic "0" are also in an off state.

As a result, only the switch element SW15 in the SDRAM D15 is turned on so that a data signal DQ can be sent or received between the data signal DQ 10 TSV715 and the pad.

On the other hand, when the SDRAM chip shown in FIG. 6A is used as the SDRAM D7, the first group indication signal COSIG of logic "1" and the set indication signal D715 of logic "1" are given to the switch element SW7 from the first ROM1 and the second ROM2. As a result, the switch element SW7 is turned on so that the SDRAM D7 can send or receive a data signal DQ through the data signal DQ TSV715. When the SDRAM chip shown in FIG. 6A is used as any one of the other SDRAMs D0 to D6 and D8 to D14, it is also possible to achieve the same operation by setting the group indication signals and the set indication signals in the first ROM1 and the second ROM2.

Further, referring to FIG. 6A, resistance elements are connected as compensation impedance elements between the switch elements SW0 to SW15 of the SDRAM chip and the data signal DQ penetrating through electrodes TSV08 to TSV715, respectively. In this case, the resistance element having the largest resistance value is connected between the switch element SW0 and the TSV08 used by the SDRAMs D0 and D8 located at the nearest position from the logic LSI chip 20 while no resistance element is connected between the switch element SW15 and the penetrating through electrode TSV715 used by the SDRAMs D7 and D15 located at the farthest position from the logic LSI chip 20. In this example, the resistance element having a resistance value of 15 times a penetrating through electrode resistance RVIA (RVIA×15) is connected to the switch element SW0.

With a greater distance from the logic LSI chip 20, a resistance with a smaller value is connected. In the case of this example, the resistance element with a resistance value of RVIA×14 is connected to the switch element SW8 and the resistance elements with resistance values of RVIA×13 and RVIA×12 are connected to the switch elements SW1 and SW9, respectively.

As described above, the structure of the SDRAM chip shown in FIG. 6A can be directly applied to the SDRAMs D0 to D15 except setting the first ROM1 and the second ROM2. Therefore, the SDRAMs D0 to D15 can be easily manufactured by incorporating 16 kinds of resistance elements shown in FIG. 6A into each SDRAM chip. For the overall impedance adjustment, a resistance element may be added also between the TSV715 and the switch element SW15.

The above-mentioned resistance elements as the compensation impedance elements each have a trimming function or element (not illustrated) used for finely adjusting its resistance value (impedance value). Manufacturing variations in the above-mentioned TSV forming process, bump forming process, and TSV-bump connection process are tested after the manufacture of the semiconductor device and, according to the results of the test, the resistance values of the resistance elements are finely adjusted by the use of the trimming elements. This makes it possible to achieve substantially real equi-length interconnections that respond to the manufacturing results and that connect between the controlled chips stacked in the semiconductor device. The test results are stored in third ROMs (not illustrated) incorporated in the controlled chips, respectively. The resistance values of the resistance elements are individually adjusted by controlling the trimming elements based on the test results stored in the third ROMs.

In the SDRAM chip shown in FIG. 6B, the chip switch circuit portion CSWC connected to the control signal CS0/1 VIAC0 and VIAC1 includes the switch elements SWC0 to SWC15 that are selectively turned on in response to the group indication signals COSIG and C1SIG and the set indication signals D08 to D715 from the first ROM1 and the second ROM2. Between each of the switch elements SWC0 to SWC15 and the VIAC0 or VIAC1, a resistance element having a larger resistance value is connected as a compensation impedance element as the corresponding SDRAM chip is located closer to the logic LSI chip 20 while a resistance element having a smaller resistance value is connected as a compensation impedance element as the corresponding SDRAM chip is located farther from the logic LSI chip 20. Also in this case, no resistance element is connected to the switch element SWC15 that corresponds to the uppermost SDRAM 15.

Since the SDRAM chip having these resistance elements can be used as each of the SDRAMs D0 to D15, the SDRAMs D0 to D15 can be easily manufactured without increasing manufacturing processes only by designing each semiconductor chip to have the respective resistance elements. That is, when forming the address, clock, and command through-silicon vias (TSVs), resistance elements having the above-mentioned resistance values may be buried in those electrodes.

As shown in FIGS. 6A to 6C, by preparing all the resistance elements with resistance values that correspond to the stacked positions of the SDRAM chips over the logic LSI chip 20 and by selecting the resistance elements in accordance with the stacked positions and the sets (DRAM sets), it is possible to compensate for variations in phase of data signals DQ input to the logic LSI chip 20. Further, it is also possible to compensate for variations in phase of clocks, addresses, and commands with respect to the SDRAM chips.

Therefore, it is seen that the semiconductor device according to the second embodiment of this invention shown in FIGS. 5 and 6A to 6C can form a semiconductor device with a phase variation compensation function. In other words, by selectively connecting compensation resistances that are complementary to resistances in through-silicon vias (TSVs) at stacked positions, respectively, to make the resistances in all the through-silicon vias (TSVs) substantially equal to each other, it is possible to equalize phase variations not only in data signals DQ, but also in clocks, addresses, and commands.

Further, by employing the structure in which the stacked SDRAM chips are divided into the groups (chip selection groups) and the through-silicon vias (TSVs) are each shared by the groups, it is possible to reduce by half the load of each SDRAM chip as compared with the case where the SDRAM chips are not divided into the groups.

Figure 7A:
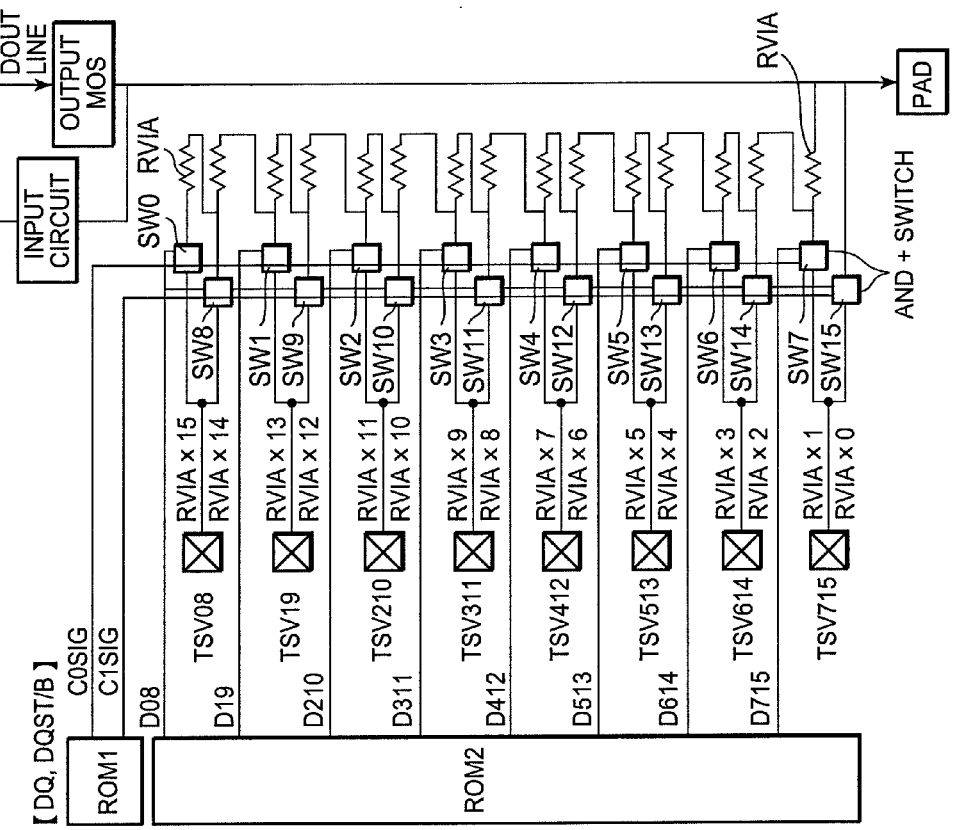
FIGS. 7A and 7B are diagrams for explaining SDRAM chips used in a semiconductor device according to a third embodiment of this invention.
Figure 7B:
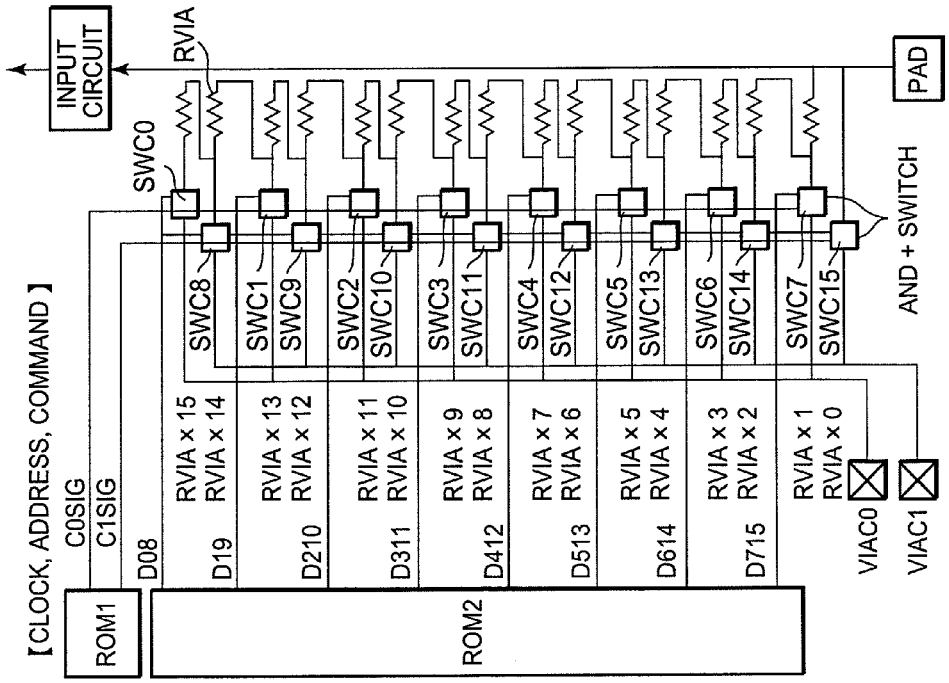

Referring to FIGS. 7A and 7B, a description will be given about another example of a SDRAM chip serving as a controlled chip in a semiconductor device according to a third embodiment of this invention. The SDRAM chip shown in FIGS. 7A and 7B also has a phase variation compensation function like the SDRAM chip shown in FIGS. 6A to 6C. FIG. 7A is for explaining compensation resistances for phase variation compensation connected to data signal DQ TSV08 to TSV715 while FIG. 7B is for explaining compensation resistances connected to clock/address/command control signal VIAC0 and VIAC1.

The SDRAM chip shown in FIG. 7A has a structure in which all the compensation resistances have the same resistance value (herein, equal to a resistance value of a penetrating through electrode resistance RVIA). When the SDRAM chip is used as an uppermost SDRAM D15, no compensation resistance is connected, which is the same as in FIG. 6A. Accordingly, when the SDRAM chip is used as the SDRAM D15, a data signal DQ is sent or received between the data signal DQ TSV715 and an internal circuit of the SDRAM D15 not through any compensation resistance.

When the SDRAM chip is used as a SDRAM D7, a data signal DQ from the SDRAM D7 is output to a pad through one compensation resistance RVIA. On the other hand, when the SDRAM chip is used as either one of SDRAMs D6 and D14, a data signal DQ from the SDRAM D6 or D14 is output to a pad through three or two compensation resistances RVIA. Likewise, when the SDRAM chip is used as a SDRAM D0 located closest to a logic LSI chip 20, a data signal from the SDRAM D0 is output through 15 compensation resistances RVIA. Likewise, a data signal from a SDRAM D8 is output through 14 compensation resistances RVIA.

That is, in the SDRAM chip shown in FIG. 7A, each compensation resistance RVIA is connected between adjacent two switch elements, i.e. between SW0 and SW8, between SW8 and SW1, between SW1 and SW9, and so on, but not between the data signal DQ TSV08 to TSV715 and the switch elements SW0 to SW15. As a result, a data signal DQ from the selected SDRAM chip is output to a pad from the selected switch element through the plurality of compensation resistances RVIA (except the SDRAMs D7 and D15). In this case, since the other switch elements are not selected, the compensation resistances RVIA are connected in series between the selected switch element and the pad so that the data signal DQ is output through a total resistance value which is a multiple of the value of the compensation resistance RVIA. Therefore, with this structure, it is also possible to compensate for phase variations like in FIGS. 6A to 6C.

The circuit shown in FIG. 6C can be used as each of the switch elements SW0 to SW15.

In the SDRAM chip shown in FIG. 7B, it is also possible to achieve a compensation resistance structure available when the SDRAM chip is used as any one of the SDRAMs D0 to D15. That is, compensation resistances RVIA are provided outside switch elements SWC0 to SWC7, i.e. on the pad side of the SDRAM chip. In this structure, a control signal such as a clock signal, an address signal, or a command signal is supplied from the control signal VIAC0 or VIAC1 through the number of compensation resistances RVIA that corresponds to a stacked position and a set (DRAM set) of the selected SDRAM chip. Therefore, with the circuit structure of FIG. 7B, it is also possible to compensate for phase variations of the control signal.

Referring to FIGS. 8A, 8B, and 8C, a semiconductor device with a phase variation compensation function according to a fourth embodiment of this invention will be described. The semiconductor device shown in FIG. 8A has a structure in which only either one of each of SDRAM pairs forming sets (DRAM sets) and sharing data signal DQ TSVs, respectively, is connected to the corresponding shared data signal DQ TSV while the other SDRAM is completely disconnected from the corresponding shared data signal DQ TSV, thereby not only compensating for phase variations of data signals DQ, but also reducing by half the load capacitance of data buses formed by the data signal DQ penetrating through electrodes TSV. This will be explained in more detail.

In order to simplify the explanation, FIG. 8A shows only SDRAMs D15 and D7 among SDRAMs D0 to D15, wherein the SDRAMs D15 and D7 respectively have RLWLON (Read Latency Write Latency ON) generation circuits 9015 and 907 that respectively put the SDRAMs D15 and D7 into an off state for a period of read latency (RT) or write latency (WT) while put the SDRAMs D15 and D7 into an on state for the other period. In the example shown in FIGS. 8A to 8C, switch elements sa and sb, each having a structure shown in FIG. 8C, are provided in each of chip switch circuits CS15 and CS7 of the SDRAMs D15 and D7.

As shown in FIG. 8C, the switch elements sa and sb each comprise a NAND circuit that outputs NAND of three inputs from the RLWLON generation circuit 90 (index omitted), a first ROM1, and a second ROM2, an inverter, and a CMOS switch. As a result, in response to a logic "1" level signal (on signal) from the RLWLON generation circuit 90 and a logic "1" level from the first ROM1 and the second ROM2, the CMOS switch is turned on and outputs a data signal DQ from the TSV to the pad side.

In FIG. 8A, it is assumed that the RLWLON generation circuit 9015 of the SDRAM D15 outputs a logic "0" level signal while the RLWLON generation circuit 907 of the SDRAM D7 outputs an on signal of logic "1". In this case, even if a logic "1" level is received as a second group indication signal C1SIG and a set indication signal D715 from the first ROM1 and the second ROM2, the upper switch element sa in the chip switch circuit CS15 of the SDRAM D15 is held in an off state due to the logic "0" level signal from the RLWLON generation circuit 9015. Further, the lower switch element sb in the chip switch circuit CS15 is also held in an off state due to the RLWLON signal of logic "0". Therefore, the SDRAM D15 is in a state completely disconnected from the data signal DQ TSV715.

On the other hand, the upper switch element sa in the chip switch circuit CS7 of the SDRAM D7 is given the RLWLON signal of logic "1" from the RLWLON generation circuit 907, a second group indication signal C1SIG of logic "0", and a set indication signal D715 of logic "1" while the lower switch element sb in the chip switch circuit CS7 is given the RLWLON signal of logic "1" from the RLWLON generation circuit 907, a first group indication signal COSIG of logic "1", and a set indication signal D715 of logic "1". Herein, since the SDRAM D7 belongs to the first group, the first group indication signal COSIG is logic "1" while the second group indication signal C1SIG is logic "0". Further, the set indication signal D715 is logic "1". In this state, when the RLWLON signal of logic "1" is given from the RLWLON generation circuit 907 of the SDRAM D7, the lower switch element sb in the chip switch circuit CS7 is put into an on state.

Therefore, only the SDRAM D7 is connected to the data signal DQ TSV715 while the SDRAM D15 sharing the TSV715 is completely disconnected from the TSV715. That is, connection/disconnection of each of the SDRAMs D15 and D7 with respect to the data signal DQ TSV715 is determined based on an output of the RLWLON generation circuit 90, i.e. a RLWLON signal.

Referring to FIG. 8B, there is shown a planar structure of a SDRAM chip that can be used as each of the SDRAMs D15 and D7 shown in FIG. 8A. The SDRAM chip shown in FIG. 8B comprises data signal DQ TSV08 to TSV715, switch elements SW0 to SW15 that correspond to the switch elements sa and sb in the chip switch circuit CS15 or CS7 shown in FIG. 8A, a RLWLON generation circuit 90, a first ROM1, and a second ROM2. This structure is the same as that shown in FIG. 6A except that a RLWLON signal is given to the switch elements SW0 to SW15 from the RLWLON generation circuit 90 and, further, the operations of the switch elements SW0 to Sw15 shown in FIG. 8B are determined by the RLWLON signal, which is also the same as in FIG. 8A. Therefore, explanation thereof is omitted herein.

At any rate, as shown in FIG. 8B, by providing the switch elements SW0 to SW15 that operate according to the signal from the RLWLON generation circuit 90, only either one of each of the SDRAM pairs forming the sets (DRAM sets) and sharing the data signal DQ TSVs, respectively, can be connected to the corresponding shared data signal DQ TSV while the other SDRAM can be completely disconnected from the corresponding shared data signal DQ TSV.

Like in FIG. 6A, compensation resistances respectively having resistance values of (RVIA×15 to 0) are connected between the switch elements SW0 to SW15 and the data signal DQ TSV08 to TSV715, thereby forming a semiconductor device also having a phase variation compensation function. It is needless to say that compensation resistances may be provided at the positions shown in FIG. 7A.

In FIG. 8A, only the single data signal DQ TSV715 has been described. However, actually, as described with reference to FIGS. 1 and 3, each SDRAM chip has 256 penetrating through electrodes and data signal DQ buses to form TSVs.

If the structure shown in FIGS. 8A and 8B is employed for such data signal DQ buses, there are the following advantages in write and read 10 operations.

First, the advantages in the write operation will be explained. The load capacitance to 256 data signals DQ is reduced by half. Accordingly, the operating current is reduced and the high-frequency operation is achieved. Further, load capacitance variations of the data buses caused by a capacitance variation of (2±0.5) pF possessed by each DQ pin are also reduced. Therefore, SDRAM input set-up and hold margin are increased.

On the other hand, there are the following advantages in the read operation. Since the DQ load on the SDRAM chip side of the 256 data buses is reduced by half, the operating current is reduced and the high-frequency operation is achieved. It is also possible to remove capacitance variations of the data buses. It is possible to remove interference due to a reflected wave caused by L1 of the SDRAM D15. Logic LSI chip input set-up and hold margin are increased.

Figures 9A, 9B:
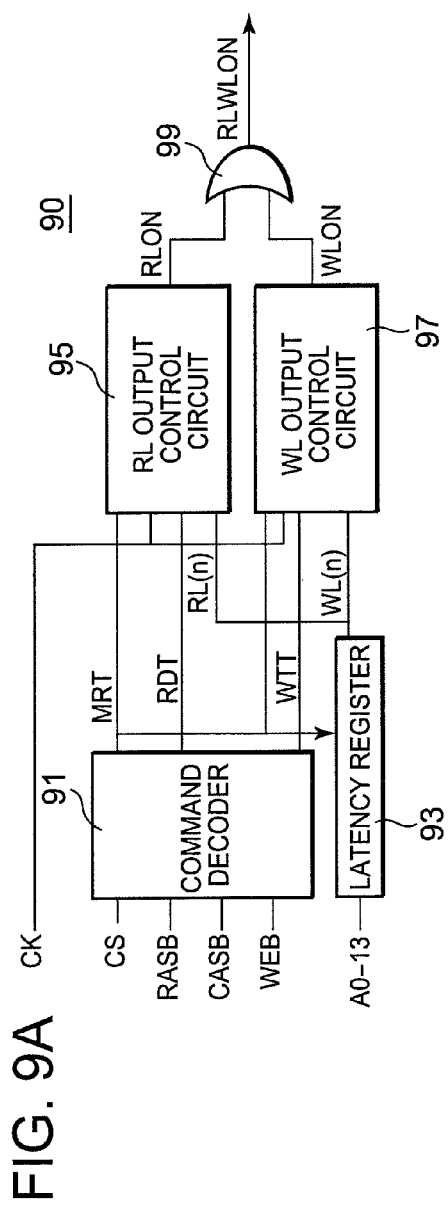
FIGS. 9A and 9B are circuit diagrams showing a RLWLON generation circuit used in the semiconductor device shown in FIGS. 8A to 8C.

Referring to FIGS. 9A and 9B, one example of the RLWLON generation circuit 90 shown in FIGS. 8A to 8C will be described. The illustrated RLWLON generation circuit 90 comprises a command decoder 91, a latency register 93, a RL (Read Latency) output control circuit 95, a WL (Write Latency) output control circuit 97, and an OR circuit 99. The command decoder 91 outputs a mode register signal (MRT), a read signal (RDT), and a write signal (WTT) in response to a chip select (CS) signal, RASB, CASB, and WEB. Herein, the mode register signal (MRT) is a logic "1" level signal indicative of latency operation and the read signal (RDT) and the write signal (WTT) are logic "1" level signals indicative of read and write operations, respectively.

The mode register signal (MRT) is output to the RL output control circuit 95 and the WL output control circuit 97 and also given to the latency register 93. An address signal A0-A13 is input to the latency register 93 and the mode register signal (MRT) indicates a latency mode set at a predetermined bit of the address signal. According to a state of the predetermined bit indicated by the mode register signal (MRT), the latency register 93 outputs a RL signal or a WL signal. The RL signal represents the number of cycles (n) from a read command until a data signal DQ is actually read while the WL signal represents the number of cycles (n) from a write command until a data signal DQ is actually written.

In response to the RL signal, a clock signal CK, and the read signal (RDT), the RL output control circuit 95 outputs, as a RLWLON signal, a RLON signal indicative of an output period of a data signal DQ through the OR circuit 99. In other words, after the number of cycles (n) of the clock signal represented by the RL signal, the SDRAM chip is connected to the data signal DQ penetrating through electrode (TSV) for a period in which the RLON signal has a logic "1" level. On the other hand, the SDRAM chip is disconnected from this penetrating through electrode (TSV) for a period in which the RLON signal has a logic "0" level. Accordingly, the load capacitance from this SDRAM chip is in an off state.

Likewise, in response to the WL signal, the clock signal CK, and the write signal (WTT), the WL output control circuit 97 outputs, as a RLWLON signal, a WLON signal of logic "1" through the OR circuit 99 for a write period of a data signal DQ after the number of cycles (n) represented by the WL signal.

In FIG. 9B, one example of the circuit structure of the RL output control circuit 95 is shown. Since the circuit structure of the WL output control circuit 97 is substantially the same as that of the RL output control circuit 95 except that it operates in response to the write signal (WTT), explanation thereof is omitted herein.

The RL output control circuit 95 shown in FIG. 9B is configured to be adaptable to latency cycles of RL(1) to RL(4) and, in this connection, is provided with four AND circuits that operate in response to RL(1) to RL(4), respectively. The RL output control circuit 95 further comprises an input-side SR latch that operates in response to the mode register signal (MRT) and the read signal (RDT), 7-stage flip-flops (FF1 to FF7) that count the clock signal CK after receiving a reset signal RB from the input-side SR latch, and a logic circuit that logically processes outputs RLR1 to RLR7 of FF1 to FF7.

Next, referring also to an internal waveform diagram of the RL output control circuit 95 shown in FIG. 10, its operation will be described. FIG. 10 shows the case where the number of latency cycles (RL) in a DDR3 SDRAM is 1 and the burst length (BL) of a data signal DQ is 4. Therefore, the RL output control circuit 95 shown in FIGS. 9A and 9B starts outputting a RLON signal of logic "1" as a RLWLON signal in response to an output RLR1 of FF1 that is output when a first pulse of the clock signal CK has been counted after a read signal (RDT), and then outputs a RLON signal of logic "0" as a RLWLON signal in response to an output RLR4 of FF4 indicative of having counted a fourth pulse of the clock signal CK.

Specifically, as shown in FIG. 10, a mode register signal (MRT) takes a logic "1" level in response to a mode register command (MRS) and, simultaneously, a RL(1) signal takes a logic "1" level. In this state, when a read command (READ) is given, the command decoder 91 shown in FIG. 9A outputs a read signal (RDT) so that the input-side SR latch shown in FIG. 9B outputs a reset signal RB to FF1 to FF7. Thus, the reset state of FF1 to FF7 is released.

In this state, FF1 to FF7 count the clock signal CK and produce outputs RLR1 to RLR7, respectively. Among the outputs of FF1 to FF7, the output RLR1 of FF1 is directly input to the AND circuit which is given RL(1). In response to the output RLR1 of FF1, an output of the AND circuit given RL(1) takes a logic "1" level and is output as a RLON signal through an output-side OR circuit (through VIA7D in FIG. 10).

The logic "1" level state of the RLON signal continues until the output RLR4 of FF4 takes a logic "1" level. As a result, the RLON signal shown in the lowermost line in FIG. 10 is output from the RL output control circuit 95. On the other hand, when the output RLR4 of FF4 takes the logic "1" level, the input-side SR latch is put into a reset state.

In this example, since RL(1) is set, an output of the AND circuit given RL(1) takes a logic "1" level in response to a first pulse of the clock signal CK after RDT. As a result, a RLON signal of logic "1" is output from the output-side OR circuit. Then, FF1 to FF7 continue to count the clock signal CK and until the output RLR4 of FF4 takes a logic "1" level, i.e. until the burst length (BL) becomes 4, the RLON signal continues to have a logic "1" level.

While the RLON signal has the logic "1" level, a data signal DQ is read in a burst fashion from the SDRAM. On the other hand, when the RLON signal takes a logic "0" level, this SDRAM is disconnected so that no data signal DQ is output. Accordingly, the load capacitance from the disconnected SDRAM becomes off so that it is possible to reduce by half the load of a data signal DQ.

In the above-mentioned example, the description has been given of the case where the read write latency ON (i.e. RLWLON) generation circuit is connected to the switch elements SW of each SDRAM. However, this invention is by no means limited thereto, but is also applicable to the case where an on-die termination (ODT) generation circuit is connected to chip switch circuits of each SDRAM.

In the above-mentioned embodiments, the description has been given of the case where the compensation resistances are provided in each SDRAM, but similar compensation resistances may be provided in the control chip 20. In this case, if a compensation resistance equivalent to the compensation resistance connected to the switch element corresponding to the SDRAM chip closest to the control chip 20 is connected to each data signal DQ interconnection, it is possible to constantly maintain an impedance-matched state in a read/write operation in a stacked semiconductor device.

INDUSTRIAL APPLICABILITY

It is apparent that the basic technical idea of this invention is not limited to the above-mentioned embodiments but may be modified and changed without departing from the scope and spirit of this invention. For example, although only the SDRAM chips are described in the embodiments, this invention is not limited thereto. This invention is applicable regardless of the function of chips and thus is applicable to any structure in which signal lines commonly provided in a plurality of chips continuously pass through from the uppermost chip to the lowermost chip. Further, the controlled chips (slave chips) are not limited to the SDRAMs and may be, for example, SRAMs or nonvolatile memories. Further, the circuit types are not limited to those disclosed in the embodiments. Although the control chip is disposed at the lowermost position in the embodiments, it may alternatively be disposed at the uppermost position.

A transistor may be a field effect transistor (FET) such as MOS (Metal Oxide Semiconductor), MIS (Metal-Insulator Semiconductor), or TFT (Thin Film Transistor), or a transistor other than FET, such as a bipolar transistor. An NMOS transistor (n-channel MOS transistor) is a typical example of a first conduction-type transistor while a PMOS transistor (p-channel MOS transistor) is a typical example of a second conduction-type transistor. A plurality of systems are incorporated in a system-in-package. This may be exemplified by a system-in-package in which a first system comprising a plurality of DRAM chips as slave chips and a master chip and a second system comprising a plurality of NAND flash memory chips as slave chips and a master chip are integrally packaged. As a single system, it may be a system in which DRAM chips and NAND flash memory chips are controlled by a single master chip.

This invention is not limited to the above-mentioned memory systems, but is applicable to the whole range of semiconductor products incorporating CPU (Central Processing Unit), MCU (Micro Control Unit), DSP (Digital Signal Processor), ASIC (Application Specific Integrated Circuit), ASSP (Application Specific Standard Product), and the like.

Further, a system-in-package to which this invention is applied is applicable to a semiconductor device such as MCP (Multi-Chip Package) or POP (Package-On-Package). In the case of POP, the penetrating through electrodes TSV disclosed in the embodiments can be replaced by, for example, ball bumps that connect between stacked individual packages.

Further, a structure may be employed in which first and second controlled chip groups each comprising a plurality of controlled chips are disposed on opposite sides of a control chip and are connected together through penetrating through electrodes, respectively.

Further, various combinations or selections of various disclosed elements can be made within the scope of claims of this invention. That is, it is readily understood that this invention includes various changes or modifications that can be made by a person skilled in the art according to the entire disclosure including the claims and the technical idea.

What is claimed is:

1. A device comprising:
a first memory chip and a third memory chip that belong to a first group;
a second memory chip and a fourth memory chip that belong to a second group, one of the first and second chips being stacked higher than the other of the first and second chips; and
a first terminal configured to indicate which one of the first and second groups is accessed, the first and second groups being different from each other.

2. The device of claim 1, wherein the first terminal is configured to provide a first control signal taking one of first and second levels, the first level of the first control signal being taken to access the first group to which the first and third memory chips belong, and the second level of the first control signal being taken to access the second group to which the second and fourth memory chips belong.

3. The device of claim 1, wherein the third memory chip is stacked higher than the fourth memory chip when the first memory chip is stacked higher than the second memory chip.

4. The device of claim 1, further comprising:
a second terminal configured to indicate which one of first and second sets is accessed, the first and second memory chips belonging to the first set, and the third and fourth memory chips belonging to the second set, the first and second sets being different from each other.

5. The device of claim 4, wherein the second terminal is configured to provide a second control signal taking one of third and fourth levels, the third level of the second control signal being taken to access the first set to which the first and second memory chips belong, and the fourth level of the second control signal being taken to access the second set to which the third and fourth memory chips belong.

6. The device of claim 1, further comprising:
a circuit is configured to provide a first control signal to the first terminal to indicate which one of the first and second groups is accessed.

7. The device of claim 1, wherein each of the first and second memory chips is one of a volatile memory chip and a non-volatile memory chip.

8. The device of claim 1, wherein the first memory chip comprise:
a first semiconductor substrate, and
a first via formed through the first semiconductor substrate, and
wherein the second memory chip comprise:
a second semiconductor substrate, and
a second via formed through the second semiconductor substrate, and
wherein the first terminal is associated with the first via and second via.

9. A device comprising:
a first chip and a third chip that belong to a first group;
a second chip and a fourth chip that belong to a second group, one of the first and second chips being stacked higher than the other of the first and second chips; and
a fifth chip configured to indicate which one of the first and second groups is accessed, the first and second groups being different from each other.

10. The device of claim 9, wherein the fifth chip is configured to provide a first control signal taking one of first and second levels, the first level of the first control being taken to access the first group to which the first and third chips belong, and the second level of the first control signal being taken to access the second group to which the second and fourth chips belong.

11. The device of claim 9, wherein the fifth chip is one of a control chip and a logic chip.

12. The device of claim 9, wherein the fifth chip is configured to indicate which one of first and second sets is accessed, the first and second chips belonging to the first set, and the third and fourth chips belonging to the second set, the first and second sets being different from each other.

13. The device of claim 12, wherein the fifth chip is configured to provide a second control signal taking one of third and fourth levels, the third level of the second control signal being taken to access the first set to which the first and second chips belong, and the fourth level of the second control signal being taken to access the second set to which the third and fourth chips belong.

14. A device comprising:
a first memory chip operating on a first clock and comprising a first substrate and a first via formed through the first substrate;
a second memory chip operating on a second clock and comprising a second substrate and a second via formed through the second substrate, one of the first and second memory chips being stacked higher than the other of the first and second memory chips;
a first clock terminal coupled to the first via of the first memory chip and configured to provide the first clock to the first memory chip so that the second memory chip is free from operating on the first clock; and
a second clock terminal coupled to the second via of the second memory chip and configured to provide the second clock to the second memory chip so that the first memory chip is free from operating on the second clock, and the first and second clocks being different from each other.

15. The device of claim 14, wherein the first memory chip operates on the first clock, independently of the second memory chip operating on the second clock.

16. The device of claim 14, comprising:
a third memory chip operating on the first clock and comprising a third substrate and a third via formed through the third substrate;
a fourth memory chip operating on the second clock and comprising a fourth substrate and a fourth via formed through the fourth substrate; and
wherein the first clock terminal is coupled to the third via of the third memory and configured to provide the first clock to the third memory chip so that the fourth memory chip is free from operating on the first clock, and the second clock terminal is coupled to the fourth via of the fourth memory chip and configured to provide the second clock to the fourth chip so that the fourth memory chip is free from operating one the second clock.

17. The device of claim 16, further comprising:
a first circuit configured to indicate which one of the first and third memory chips is accessed so that the one of the first and third memory operates on the first clock, and the other of the first and third memory chips is free from operating on the first clock.

18. The device of claim 16, wherein the first and third memory chips belong to a first group, the second and fourth memory chips belong to a second group, the first and second memory chips belong to a first set, and the third and fourth memory chips belong to a second set, and
wherein the device further comprises:
a first control terminal configured to indicate which one of the first and second groups is accessed, the first and second groups being different from each other; and
a second control terminal configured to indicate which one of the first and second sets is accessed, the first and second sets being different from each other.

19. The device of claim 14, further comprising:
a clock generator providing the first and second clocks to the first and second terminal, respectively.

20. The device of claim 14, wherein the first memory chip comprise a first DQ via formed through the first substrate, and the first DQ via configured to provide first data synchronized with the first clock independently of the second clock,
and where the second memory chip comprise a second DQ via formed through the first substrate and configured to provide second data synchronized with the second clock independently of the first clock.

\* \* \* \* \*